United States Patent
Xi et al.

(10) Patent No.: US 11,563,511 B2
(45) Date of Patent: Jan. 24, 2023

(54) POLAR CODING SYSTEM FOR ULTRA-RELIABLE LOW LATENCY COMMUNICATION

(71) Applicant: IDAC Holdings, Inc., Wilmington, DE (US)

(72) Inventors: Fengjun Xi, San Diego, CA (US); Chunxuan Ye, San Diego, CA (US); Kyle Jung-Lin Pan, Saint James, NY (US)

(73) Assignee: IDAC Holdings, Inc., Wilmington, DE (US)

( * ) Notice: Subject to any disclaimer, the term of this patent is extended or adjusted under 35 U.S.C. 154(b) by 0 days.

(21) Appl. No.: 16/763,615

(22) PCT Filed: Nov. 12, 2018

(86) PCT No.: PCT/US2018/060257
§ 371 (c)(1),
(2) Date: May 13, 2020

(87) PCT Pub. No.: WO2019/099319
PCT Pub. Date: May 23, 2019

(65) Prior Publication Data
US 2020/0287654 A1    Sep. 10, 2020

Related U.S. Application Data

(60) Provisional application No. 62/715,933, filed on Aug. 8, 2018, provisional application No. 62/685,044, filed
(Continued)

(51) Int. Cl.
*H04L 1/00* (2006.01)
*H03M 13/13* (2006.01)
(Continued)

(52) U.S. Cl.
CPC .......... *H04L 1/0003* (2013.01); *H03M 13/13* (2013.01); *H04L 1/0026* (2013.01);
(Continued)

(58) Field of Classification Search
CPC ... H04L 1/0003; H04L 1/0016; H04L 1/0026; H04L 1/0057; H04L 1/0061;
(Continued)

(56) References Cited

U.S. PATENT DOCUMENTS 9,032,267 B2    5/2015  Shimanuki et al.
10,375,681 B2 *  8/2019  Papasakellariou ........ H04L 1/18
(Continued)

FOREIGN PATENT DOCUMENTS

CN   107196740 A   9/2017
TW   201218710 A   5/2012

OTHER PUBLICATIONS

"3GPP Chairman's Notes RAN1 Meeting #89", May 2017.
(Continued)

*Primary Examiner* — Justin R Knapp
(74) *Attorney, Agent, or Firm* — Jerome G. Schaefer

(57) ABSTRACT

Systems, methods, and instrumentalities are described herein for supporting CBG-based retransmission with variable CBG size using variable length HARQ-ACK. A WTRU may receive a configuration to use a first table. The first table may be associated with a maximum number of code block groups per transport block (maxCBG/TB). The WTRU may determine a number of HARQ-ACK bits to send for code blocks. The determination may depend on whether an indication is received to switch from the first table to a second table. On a condition that the indication to switch from the first table to the second table is received, the WTRU may send a number of HARQ-ACK bits that is equal to two times the maxCBG/TB. The WTRU may receive a retransmission
(Continued)

of a number of code blocks, wherein a code block group size depends on a sent number of HARQ-ACK bits.

16 Claims, 26 Drawing Sheets

Related U.S. Application Data on Jun. 14, 2018, provisional application No. 62/630,465, filed on Feb. 14, 2018, provisional application No. 62/615,594, filed on Jan. 10, 2018, provisional application No. 62/586,487, filed on Nov. 15, 2017.

(51) Int. Cl.

| | |
|---|---|
| *H03M 13/00* | (2006.01) |
| *H04L 1/18* | (2006.01) |
| *H04L 5/00* | (2006.01) |
| *H04W 76/11* | (2018.01) |
| *H04L 1/20* | (2006.01) |
| *H04W 72/04* | (2009.01) |

(52) U.S. Cl.
CPC .......... *H04L 1/0061* (2013.01); *H04L 1/1819* (2013.01); *H04L 1/203* (2013.01); *H04L 5/0055* (2013.01); *H04W 72/042* (2013.01); *H04W 76/11* (2018.02)

(58) Field of Classification Search
CPC ..... H04L 1/1614; H04L 1/1819; H04L 1/203; H04L 5/0055; H04L 1/0009; H04L 1/00; H04L 1/16; H04L 1/18; H04L 1/20; H04L 5/00; H04W 72/042; H04W 76/11; H04W 72/04; H03M 13/00; H03M 13/13
See application file for complete search history.

(56) References Cited

U.S. PATENT DOCUMENTS

| | | | | |
|---|---|---|---|---|
| 10,420,089 B2* | 9/2019 | Nammi | ................ | H04L 1/0072 |
| 10,530,528 B2* | 1/2020 | Park | .................... | H04L 1/0067 |
| 10,750,488 B2* | 8/2020 | He | ........................ | H04L 1/1887 |
| 10,931,426 B2* | 2/2021 | Desai | .................... | H04L 1/1671 |
| 2020/0059327 A1* | 2/2020 | Kini | .................... | H04W 72/042 |
| 2020/0196335 A1* | 6/2020 | Lei | ........................ | H04L 1/1671 |
| 2020/0374029 A1* | 11/2020 | Yeo | ........................ | H04L 1/0045 |

OTHER PUBLICATIONS

"3GPP Chairman's notes, RAN1 NR Ad-hoc meeting", Jan. 2017.

3rd Generation Partnership Project (3GPP), R1-1608862, "Polar Code Construction for NR", Huawei, HiSilicon, 3GPP TSG RAN WG1 Meeting #86bis, Lisbon, Portugal, Oct. 10-14, 2016, 8 pages.

3rd Generation Partnership Project (3GPP), R1-1701702, "Construction Schemes for Polar Codes", Huawei, HiSilicon, 3GPP TSG RAN WG1 Meeting #88, Athens, Greece, Feb. 13-17, 2017, 7 pages.

3rd Generation Partnership Project (3GPP), R1-1702646, "Polar Code Information Bit Allocation and Nested Extension Construction", Qualcomm Incorporated, 3GPP TSG-RAN WG1 Meeting #88, Athens, Greece, Feb. 13-17, 2017, pp. 1-13.

3rd Generation Partnership Project (3GPP), R1-1713642, "DL Control for CBG (Re)Transmissions", Samsung, 3GPP TSG RAN WG1 Meeting #90, Prague, Czechia, Aug. 21-25, 2017, pp. 1-10.

Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Niu et al., "CRC-Aided Decoding of Polar Codes", IEEE Communications Letters, vol. 16, No. 10, Oct. 2012, pp. 1668-1671.

Tal et al., "How to Construct Polar Codes", IEEE Transactions on Information Theory, vol. 59, No. 10, Oct. 2013, pp. 6562-6582.

Tal et al., "List Decoding of Polar Codes", arXiv:1206.0050v1, May 31, 2012, pp. 1-11.

Trifonov, Peter, "Efficient Design and Decoding of Polar Codes", IEEE Transactions on Communications, vol. 60, No. 11, Nov. 2012, pp. 3221-3227.

\* cited by examiner

| Seg 0 | Seg 1 | ...... | Seg (C-1) | Part Seg C-1 |

POLAR CODING SYSTEM FOR ULTRA-RELIABLE LOW LATENCY COMMUNICATION

CROSS-REFERENCE

This application is the National Stage Entry under 35 U.S.C. § 371 of Patent Cooperation Treaty Application No. PCT/US2018/060257, filed Nov. 12, 2018, which claims the benefit of U.S. Provisional Application No. 62/715,933, filed Aug. 8, 2018, U.S. Provisional Application No. 62/685,044, filed Jun. 14, 2018, U.S. Provisional Application No. 62/630,465, filed Feb. 14, 2018, U.S. Provisional Application No. 62/615,594, filed Jan. 10, 2018, and U.S. Provisional Application No. 62/586,487, filed Nov. 15, 2017, all contents of which are incorporated by reference herein.

BACKGROUND

Development of new radio (NR) control structure is on-going. Polar coding may be used for control channel coding.

SUMMARY

Systems, methods, and instrumentalities are described herein for supporting CBG-based retransmission with variable CBG size using variable length HARQ-ACK. A receiving device, e.g., a wireless transmit/receive unit (WTRU), may receive a configuration to use a first table. The first table may be associated with a maximum number of code block groups per transport block (maxCBG/TB). The WTRU may attempt to decode code blocks associated with a transport block, e.g., carrying data for the WTRU. The WTRU may determine a number of HARQ-ACK bits to send for the code blocks. The determination may depend on whether an indication is received to switch from the first table to a second table (e.g., where the first table may be a high spectral efficiency modulation and coding scheme (MCS) table and the second table may be a lower spectral efficiency modulation and coding scheme (MCS) table). On a condition that the indication to switch from the first table to the second table is not received, the WTRU may send a number of HARQ-ACK bits that is equal to the maxCBG/TB. On a condition that the indication to switch from the first table to the second table is received, the WTRU may send a number of HARQ-ACK bits that is equal to two times the maxCBG/TB. The WTRU may receive a retransmission of a number of code blocks, wherein a code block group size of the retransmitted number of code blocks depends on a sent number of HARQ-ACK bits.

Systems, methods, and instrumentalities are described herein that may be used to: polar-code a payload of ultra-reliable low latency communications (URLLC) data; perform modulation and coding scheme MCS selection, transport block size (TBS) selection, and code block group (CBG) transmissions associated with the URLLC data; and/or to select channel quality indicator (CQI) values and/or a downlink control information (DCI) format for URLLC data. The polar coding, MCS selection, TBS selection, and/or CBG transmissions may be performed in accordance with one or more characteristics of the URLLC data. For example, the polar coding of the URLLC data may include receiving a payload of the URLLC data, determining a cyclic redundancy check (CRC) sequence to be attached to the payload, attaching the attaching CRC sequence to the payload, segmenting the payload into code blocks, polar-coding the segmented code blocks, interleaving the segmented code blocks, and re-ordering the code blocks. Dynamic DBG numbers may be used (e.g., for URLLC Hybrid Automatic Repeat Request (HARQ) feedback). A WTRU may be configured to receive data and transmit feedback for URLLC and/or enhanced massive mobile broadband (eMBB) services.

BRIEF DESCRIPTION OF THE DRAWINGS

A more detailed understanding may be had from the following description, given by way of example in conjunction with the accompanying drawings.

FIG. 10 is a diagram illustrating an example of repeated padding at the last segment;

FIG. 11 is a diagram illustrating an example of repeated padding at the first segment;

DETAILED DESCRIPTION

A detailed description of illustrative embodiments will now be described with reference to the various Figures. Although this description provides a detailed example of possible implementations, it should be noted that the details are intended to be exemplary and in no way limit the scope of the application.

Figure 1A:
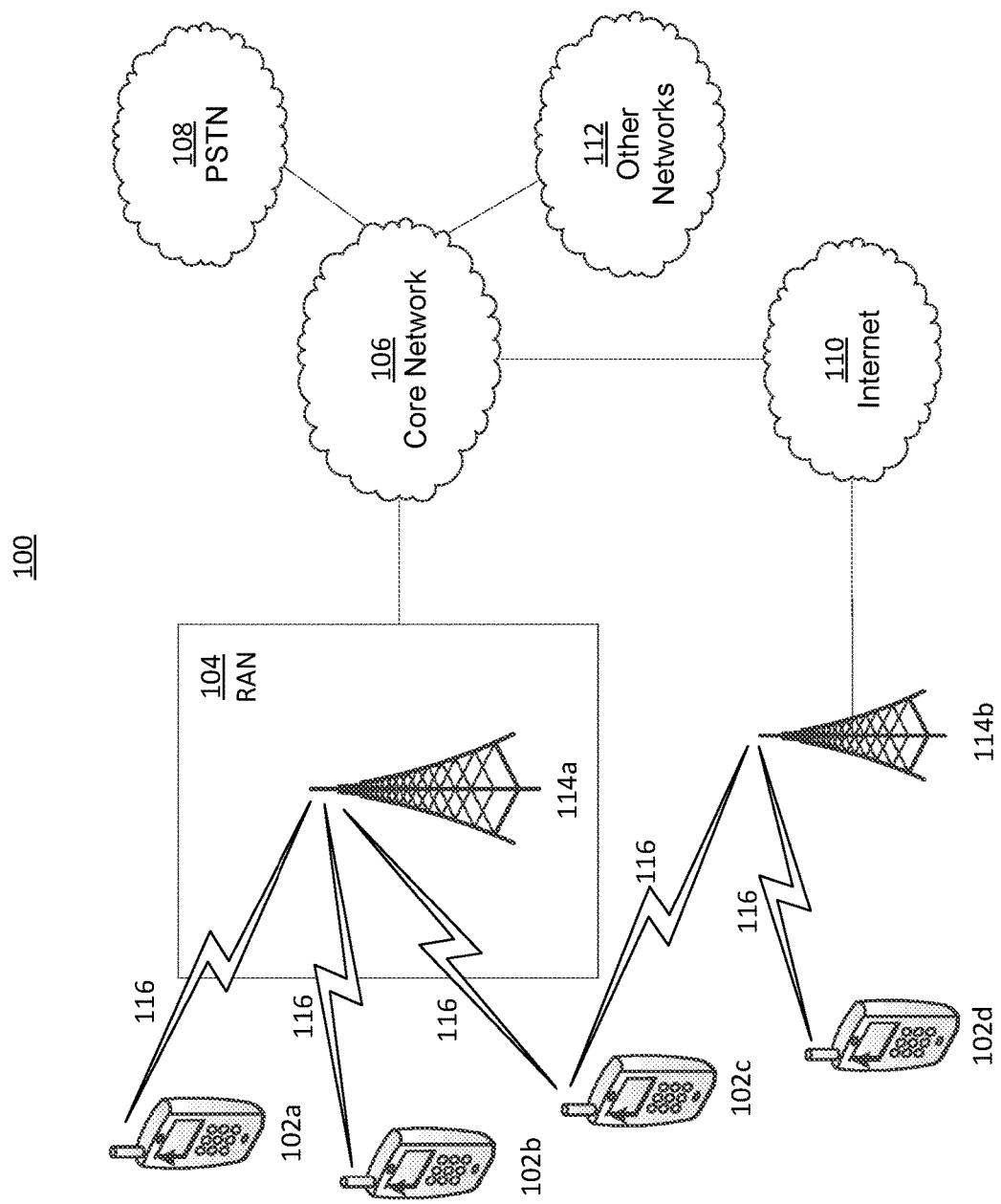
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
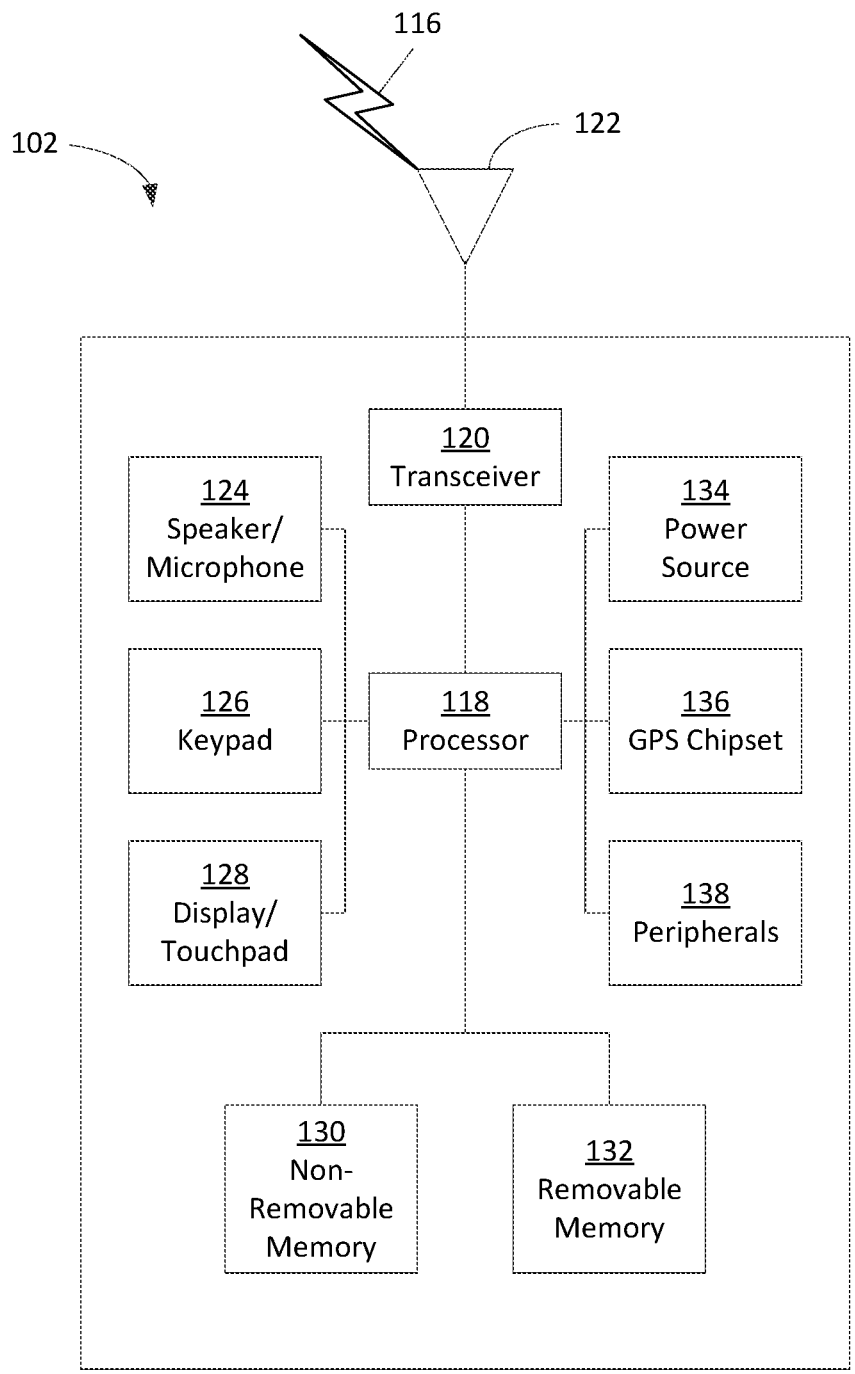
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
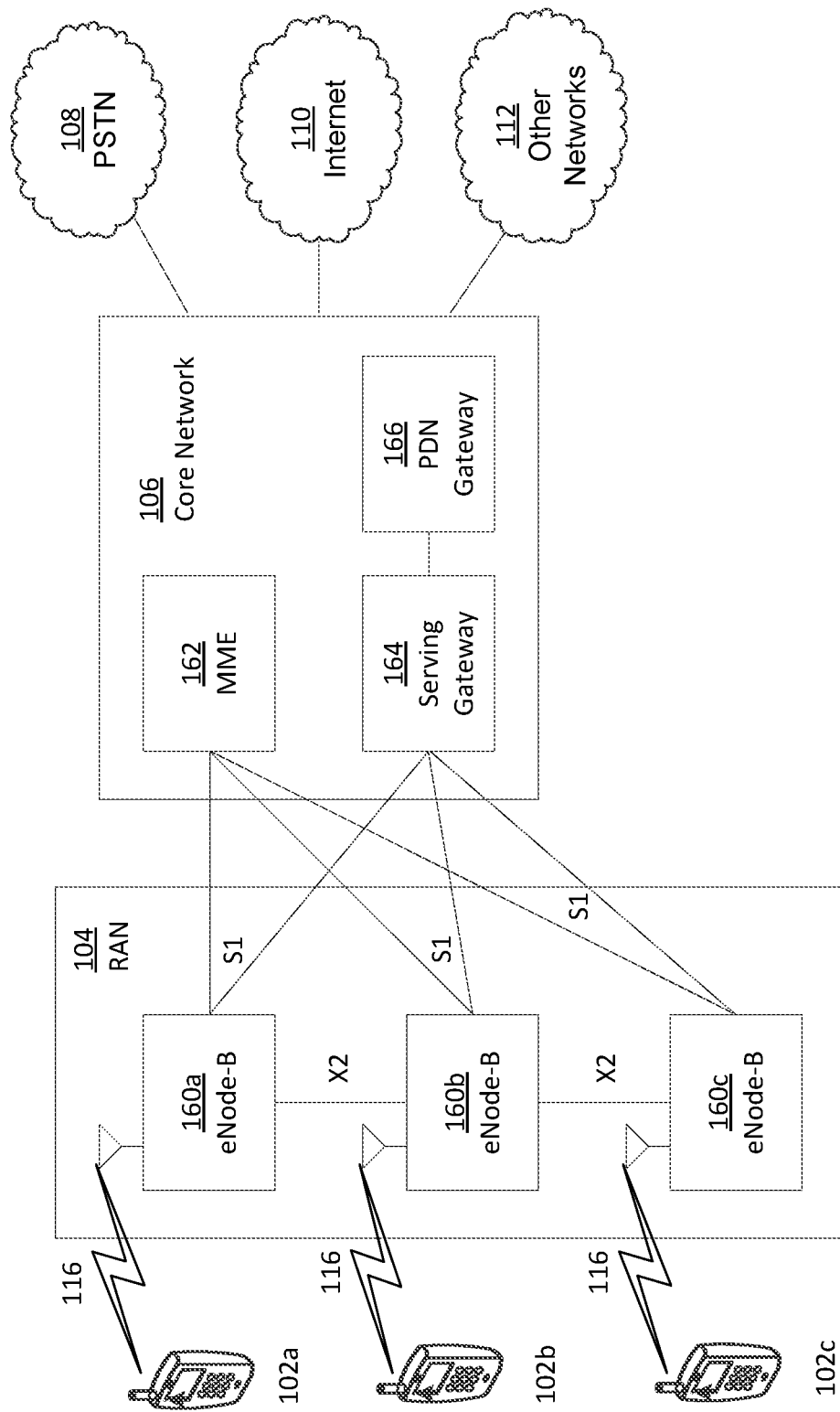
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
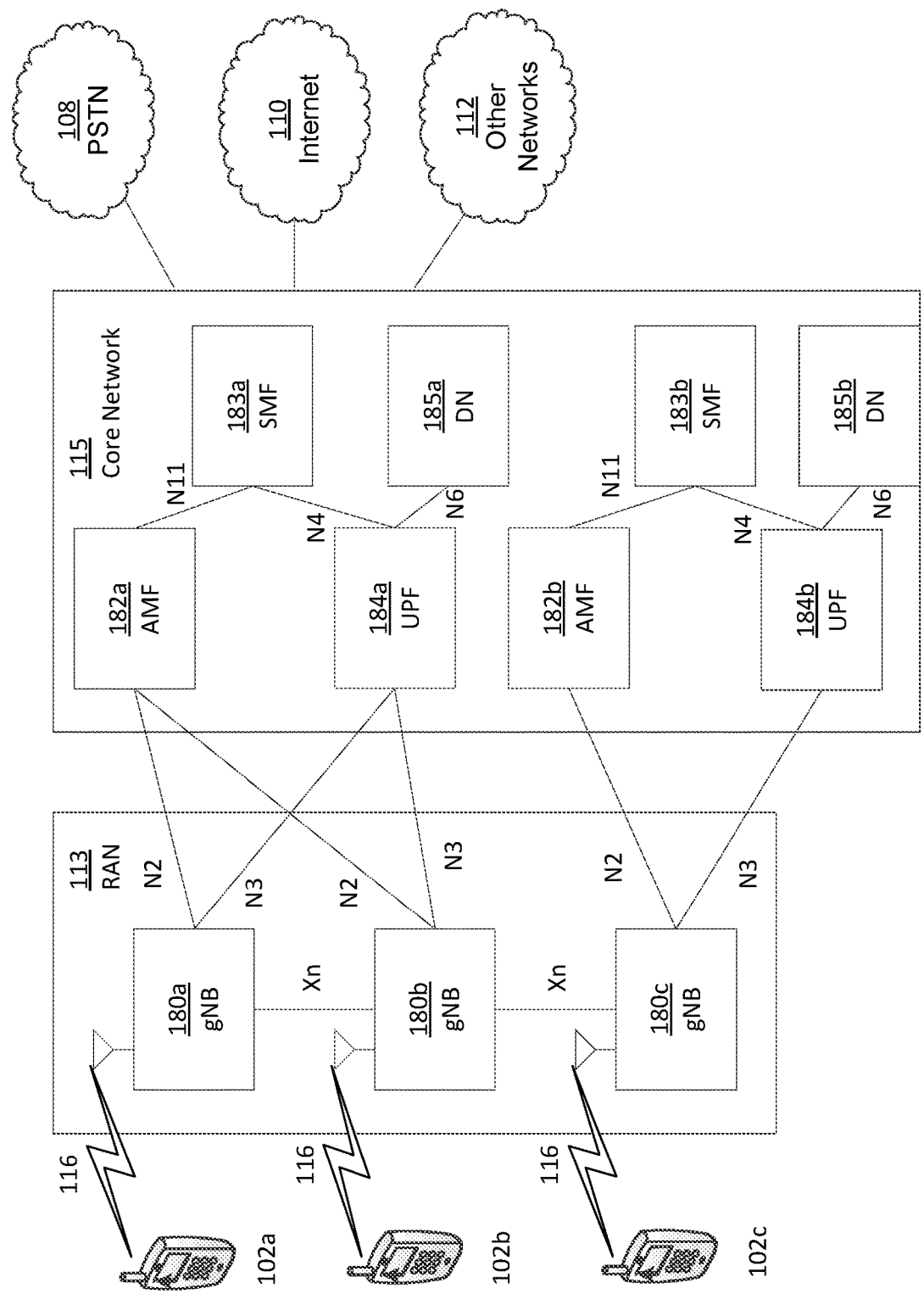
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Polar codes may be used as capacity achieving codes, e.g., similar to Turbo codes and/or low-density parity-check (LDPC) codes. Polar codes may be used as linear block codes. Polar codes may have low encoding and decoding complexity. Polar codes may have a low error floor. Polar codes may be associated with a construction technique such as an explicit construction technique.

In a (N, K) polar code, K may represent the length of an information block and N may represent the length of a coded block. The value of N may be set as a power of 2, e.g., $N=2^n$, where n is an integer value. The generator matrix of a polar code may be expressed by $G_N=B_N F^{\otimes n}$, where $B_N$ may be a bit-reversal permutation matrix, $(.)^{\otimes n}$ may denote the n-th Kronecker power, and F may be expressed as $$F = \begin{bmatrix} 1 & 0 \\ 1 & 1 \end{bmatrix}.$$

Figure 2:
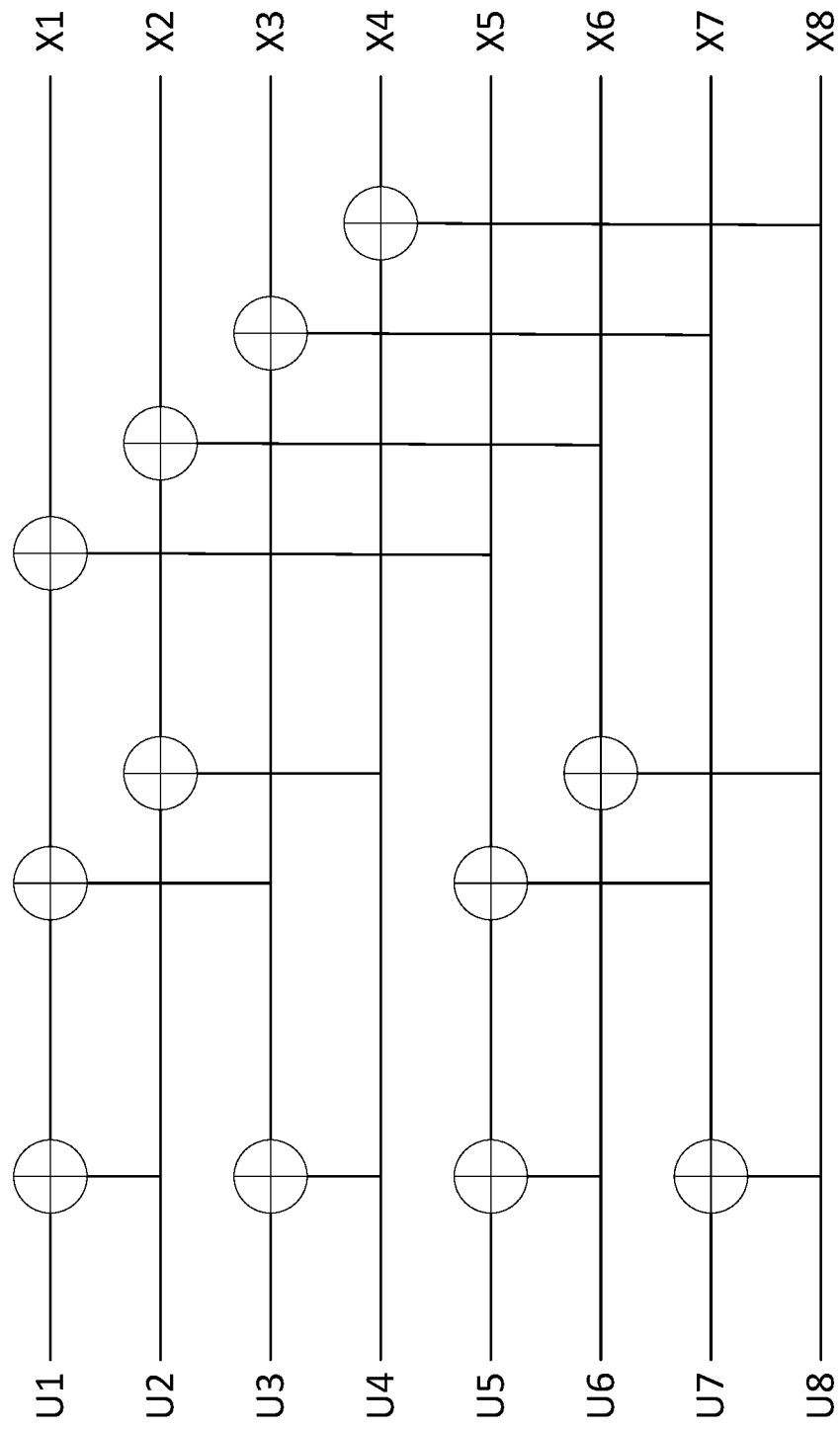
FIG. 2 is a diagram illustrating an example polar encoder.

$B_N$ may be ignored by an encoder for simplicity. Bit-reversal operation may be performed by a decoder. FIG. 2 shows an example implementation of $F^{\otimes 3}$ with N=8. The codeword of a polar code may be derived based on $x_1^N = u_1^N G_N$.

A Successive Cancellation (SC) decoding technique may be used in polar coding. Other decoding techniques may be developed based on SC decoding. Such decoding techniques may include Successive Cancellation List (SCL) decoding, CRC-Aided SCL decoding, and/or the like.

A CA (CRC-Aided) polar code may be defined as a polar code with a CRC-Aided Successive Cancellation List (SCL) decoder. CRC bits may be used (e.g., at least in CRC-aided decoding) to select a final codeword from a list of candidate codewords, e.g., at the end of a decoding process. CRC bits may be designed and used for error correction (e.g., CRC bits may be designed and used for error correction in addition to or in lieu of error detection). CRC bits may be used (e.g., additionally) for error detection functionality.

Polar codes may be designed to suit encoding and/or decoding. The design may be based on the mapping of one or more information bits (e.g., K information bits) to one or more input bits (e.g., N input bits) that are associated with a polar encoder $u_1^N$. The information bits may be put on one or more bit channels (e.g., K best bit channels). The remaining input bits (e.g., N−K input bits) that are not mapped to the information bits may be referred to as frozen bits. These frozen bits may be set as 0. The set of positions for the frozen bits may be referred to as a frozen set $\mathcal{F}$.

Bit channels (e.g., best bit channels) may be determined in various way, for example, based on real channel conditions. When determining a set of frozen channels, bit channels (e.g., all bit channels) may be ranked, e.g., based on their reliabilities. For example, a reliable bit channel may be ranked higher than a less reliable bit channel.

There may be multiple ways to determine (e.g., calculate) the reliability of a bit channel. These may include, for example, Bhattacharyya bounds, Monte-Carlo estimation, full transition probability matrices estimation, and Gaussian approximation. The determination techniques may have different computation complexity. The determination techniques may be applied to different channel conditions. Various parameters (e.g., such as design Signal to Noise Ratio (design SNR)) may be selected before the determination of reliability is started.

The rank of a bit channel may be determined based on criteria other than design SNR. For example, a rank sequence may be generated based on a formula, a rank sequence may be generated by expanding from a small sequence, etc.

Figure 3:
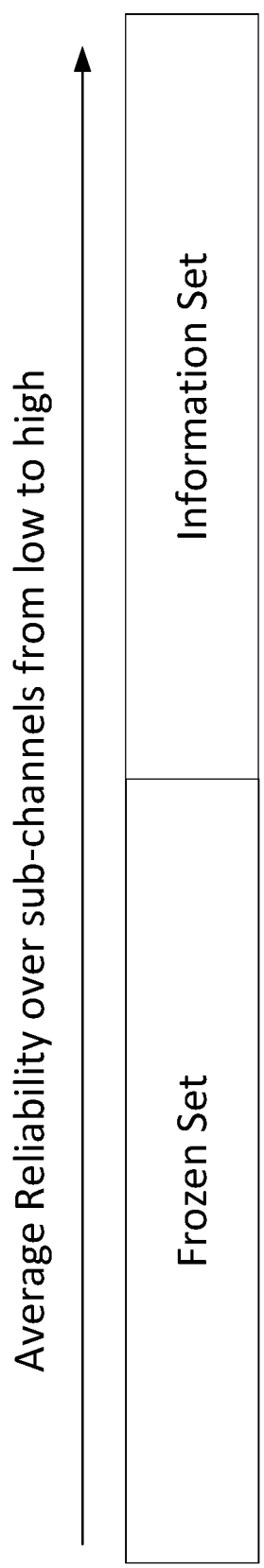
FIG. 3 is a diagram illustrating an example polar code.

Once the ranking of bit channels is determined, information bits may be put at high reliability bits channels, while frozen bits may be put at low reliability bit channels. FIG. 3 illustrates an example of this technique.

Figure 4:
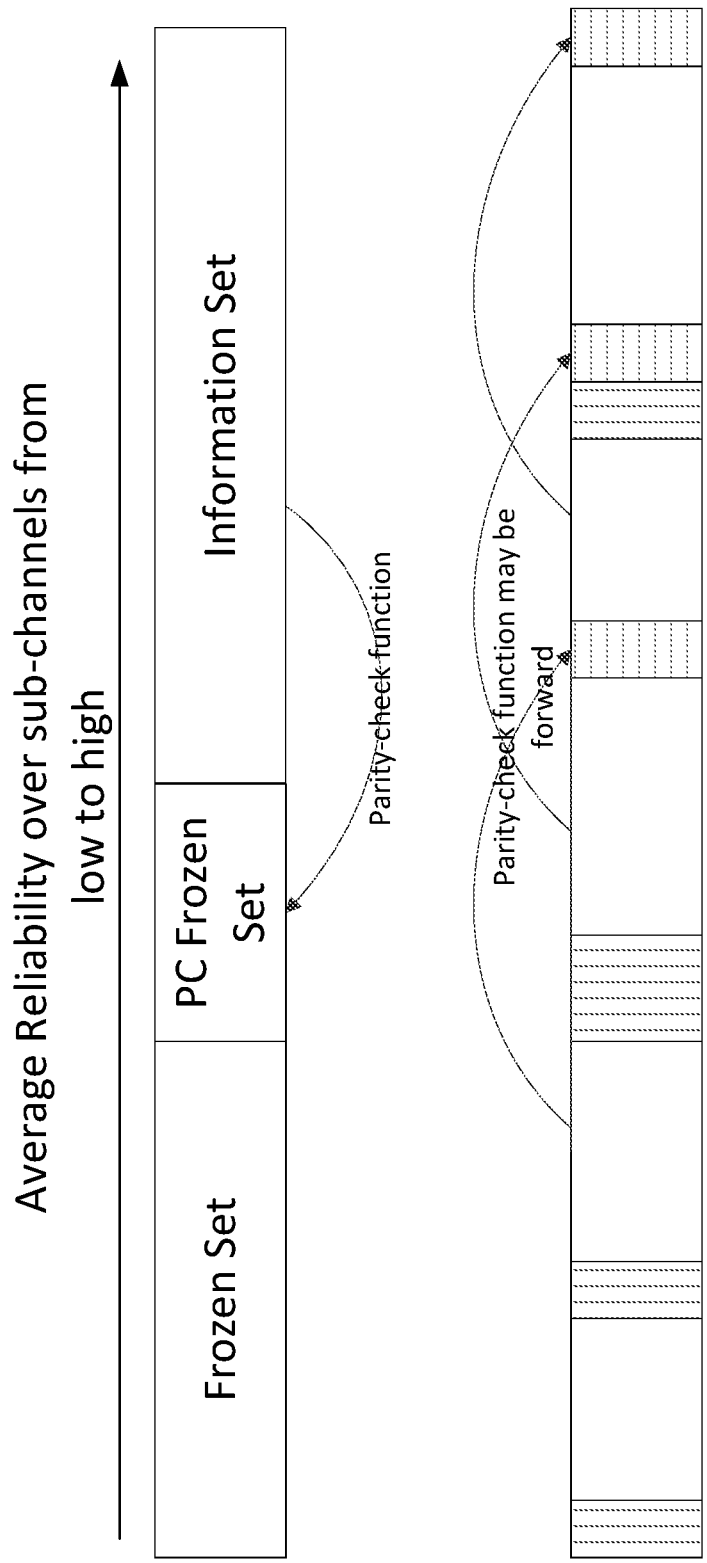
FIG. 4 is a diagram illustrating for an example parity check (PC) polar code.

Parity Check (PC) polar codes may be used. For PC-polar codes one or more of the following may apply. A subset of a frozen sub-channel set may be selected as PC-frozen sub-channels. Over these sub-channels, a PC function may be established for error correction. At a parity check sub-channel position (e.g., at each parity check sub-channel position), decoded bits involved in the PC function over a PC-frozen sub-channel may be used to prune a list decoding tree. For example, the paths that satisfy the PC function requirements may survive, and the rest may be eliminated (e.g., on the fly). The PC function may be established as forward, e.g., forward-only (e.g., to be consistent with a successive cancellation-based decoder). FIG. 4 shows an example of bit mapping between the information bits and input bits of a PC polar code.

PC polar codes may be used to remove the CRC bits of CA polar codes. The CRC bits may be used for error correction in CRC-aided SCL decoding. The removal may reduce the overhead of polar codes, which may result in coding gains.

In examples (e.g., when block sizes are not very small), polar codes may be adopted as the channel codes for UL/DL control information. CRC bits may be used for control messages (e.g., to reduce the rate of false alarms).

Polar codes for DL control channels may support one or more of the following. J' may be set to 3 or 6 (e.g., which may be down selected). J" may be set to 0. At least some of the J+J' bits may be appended. J+J' bits may be obtained. If J' is set to 6, at least some of the J+J' bits may be distributed (e.g., to support early termination in code construction). J' may be set to 6 without distributing J+J' bits. If J' is set to 3, J+J' bits may or may not be distributed. If J' is set to 3, early termination in code construction may be supported. The distribution of bits may consider the complexity and/or benefits involved therein.

Polar codes may be used for control channels (e.g., for UCI and/or DCI), e.g., in NR eMBB scenario(s). Low-density parity-check (LDPC) codes may be used for data channels. Some LDPC codes may be unfit for URLLC data (e.g., due to error floor issues). Polar codes may be used for URLLC data. A polar encoding system for URLLC data may consider features associated with polar codes in conjunction with the requirements for URLLC data transmissions.

In an NR eMBB scenario, one or more MCS tables and/or one or more TBS tables may be designed based on the eMBB scenario. In an NR URLLC scenario, one or more MCS tables may be designed, e.g., differently than those for the eMBB scenario. For instance, MCS tables for URLLC may include items with lower coding rates and/or lower modulation orders. MCS tables and/or TBS determination techniques may be designed for URLLC data (e.g., since there may be less URLLC data than eMBB data). The design may consider using polar codes for URLLC data channel, for example.

Code block group (CBG) based transmissions and retransmissions may be supported, e.g., in an NR eMBB scenario. A similar technique may be used for URLLC data (e.g., to support the low latency and high reliability requirements of URLLC data transmissions).

Figure 5:
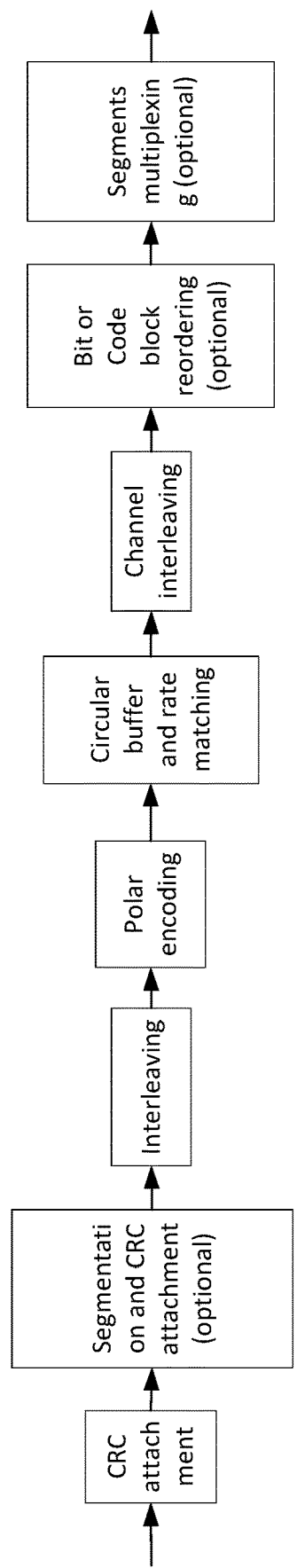
FIG. 5 is a diagram illustrating a first example polar encoder for URLLC data.

FIG. 5 shows an example polar encoding system for URLLC data.

CRC attachment may be performed for URLLC. For example, URLLC data payload may be received from an upper layer. The payload may be appended with a CRC (e.g., a transport block (TB) level CRC).

The TB level CRC length and/or polynomial may depend on the payload size and/or payload contents (e.g., data QoS). In examples, if the URLLC data payload size is less than a threshold, then the CRC length may be short (e.g., 16 bits). Otherwise, the CRC length may be longer (e.g., 24 bits). In examples, if the URLLC data have a high reliability requirement, then the CRC length may be long (e.g., 24 bits). Otherwise, the CRC length may be shorter (e.g., 16 or 19 bits).

A CRC polynomial may depend on the payload size. For a large payload size (e.g., where segmentation may be applicable), the CRC polynomial may be selected as $$g_{CRC24A}(D)\gamma[D^{24}+D^{23}+D^{18}+D^{17}+D^{14}+D^{11}+D^{10}+D^{7}+D^{6}+D^{5}+D^{4}+D^{3}+D+1]$$

which may be the same as or similar to the CRC polynomial for an eMBB data channel TB level. Such a TB level CRC may not be used for early termination operations. Other CB level CRCs may be used for early termination operations.

For a small or medium payload size (e.g., where segmentation may not be applicable), a CRC polynomial may be selected, in a first example, as $g_{CRC24C}(D)=[D^{24}+D^{23}+D^{18}+D^{17}+D^{14}+D^{11}+D^{10}+D^{7}+D^{6}+D^{5}+D^{4}+D^{3}+D+1]$. This CRC polynomial may be used in a NR DL control channel, e.g., as a distributed CRC for early termination in polar decoding. The CRC polynomial may be selected, in a second example, as $g_{CRC11}(D)=[D^{11}+D^{10}+D^{9}+D^{5}+D+1]$.

For some small payload sizes, a CRC polynomial may be selected as $g_{CRC16}(D)=[D^{16}+D^{12}+D^{5}+1]$. A different CRC polynomial may be used to achieve early termination gains in polar decoding.

A CRC length that depends on the payload size may be used for downlink transmission or uplink transmission. A single CRC polynomial may be used for one or more (e.g., all) types of payloads.

Figure 6:
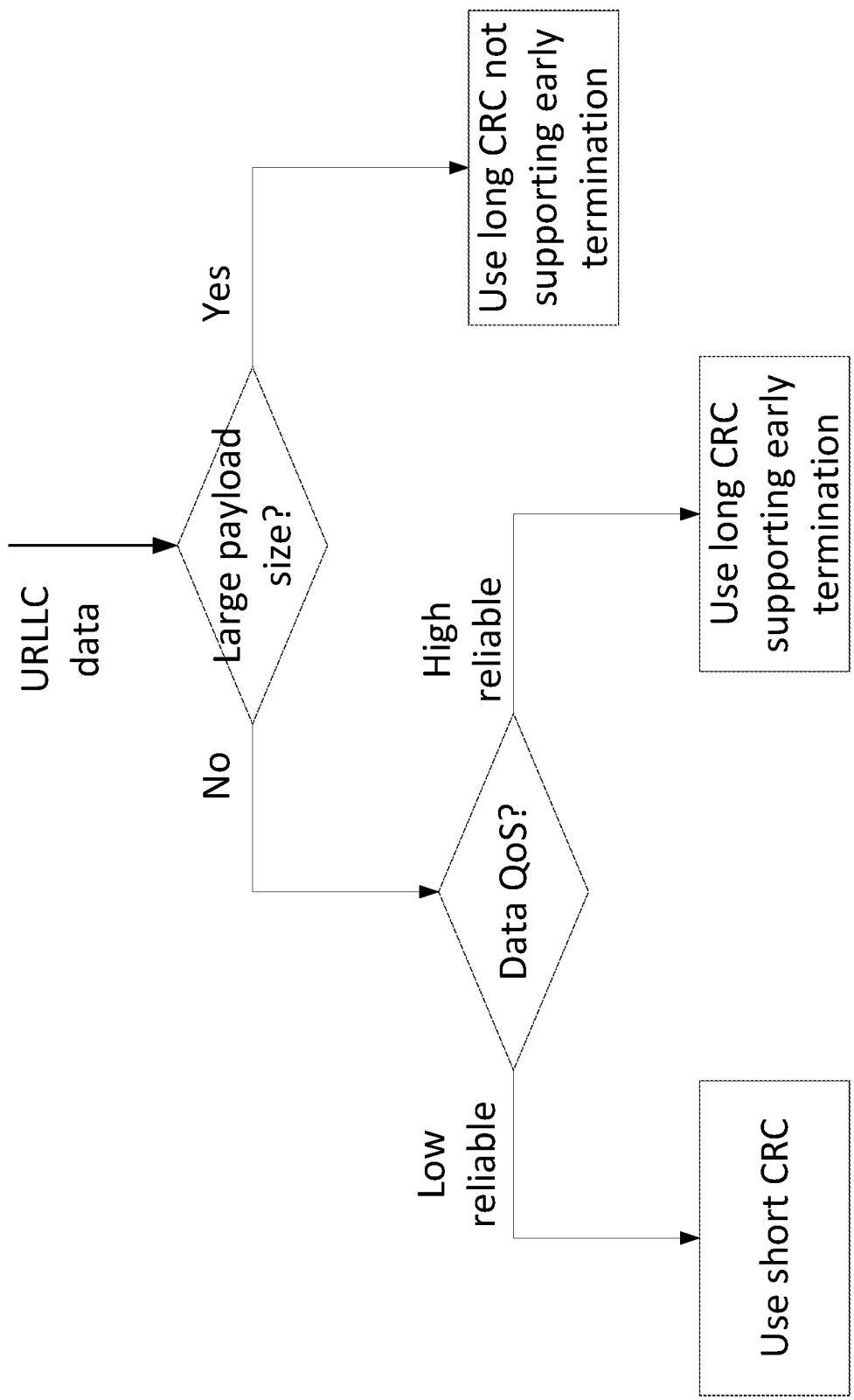
FIG. 6 is a diagram illustrating an example of CRC selection.

FIG. 6 shows an example of selecting a CRC polynomial. A payload size may be checked. If the payload size is larger than a threshold, a long CRC may be used with a polynomial that may not support early termination for polar decoding. Otherwise, data QoS may be checked. If the data has a high reliability requirement, a long CRC may be used with a polynomial that supports early termination for polar decoding. If the data has a low reliability requirement, a short CRC may be used.

TB-level CRC selection may depend on the channel code that is used or selected for URLLC data transmission. A short CRC (e.g., 16 bit CRC) may be selected for TB-level CRC (e.g., if LDPC is used for URLLC data transmission). A long CRC (e.g., 24-bit CRC) may be selected for TB-level CRC (e.g., if polar coding is used for URLLC data transmission). Different CRC lengths may be selected based on an information payload size (e.g., when LDPC is used for URLLC data transmission), e.g., a long CRC may be used for a large payload size while a short CRC may be used for a small payload size. For example, if the information payload size is less than a threshold (e.g., 1000 bits), a 16-bit CRC may be used. If the information payload size is greater than a threshold (e.g., 1000 bits), a 24-bit CRC may be used. Same length CRC may be used for different channel code (e.g., LDPC or Polar codes) while different length CRC may be selected for both channel codes based on the payload size (e.g., long CRC may be used for large payload size while short CRC may be used for small payload size). For example, if the information payload size is less than a threshold (e.g., 1000 bits), a 16-bit CRC may be used. If the information payload size is greater than a threshold (e.g., 1000 bits), a 24-bit CRC may be used.

One or a combination of the disclosed implementations herein may be used for CB level CRC length and/or polynomial selection for URLLC data transmission. URLLC data transmission may include the transmission of data channel, control channel, and/or physical signals. Different CRC lengths may be used for different payload sizes and/or contents, e.g. if polar codes are used for URLLC data transmission. For example, if a payload size is less than a first threshold, a short CRC length (e.g., 6 bits) may be used. If a payload size is not less than the first threshold and is less than a second threshold, a medium CRC length (e.g., 11 bits) may be used. If a payload size is not less than the second threshold, a large CRC length (e.g., 24 bits) may be used.

A URLLC data payload (e.g., with or including TB level CRC) may be segmented. The criteria of segmentation may include one or more of the following. The criteria may include a payload length (e.g., K bits including TB level CRC). The criteria may include an initial transmission code rate (R). The criteria may include the number of bits to be transmitted in an initial transmission (M). The criteria may include the maximum number of transmissions ($RV_{max}$). The criteria may include data QoS. The maximum number of transmissions may be related to the maximum redundancy versions, and these terminologies may be used interchangeably.

There may be multiple ways of determining whether segmentation may be applied or not.

If $M>M_{thr1}$, e.g., if the number of bits to be transmitted in the initial transmission is above a threshold, then segmentation may be applied.

If $M \cdot RV_{max} > M_{thr2}$, e.g., if the number of bits to be transmitted over all transmissions and retransmissions is above a threshold, then segmentation may be applied. Although the condition is expressed as $M \cdot RV_{max}$, other functions of (M, $RV_{max}$) may be used. For example, the condition may be expressed as: if $f(M, RV_{max}) > M_{thr2}$, then segmentation may be applied.

If $K > K_{thr}$ and/or $R < R_{thr1}$, then segmentation may be applied.

If $K > K_{thr}$ and/or $R \cdot RV_{max} < R_{thr2}$, then segmentation may be applied.

The above example thresholds, e.g., $M_{thr1}$, $M_{thr2}$, $K_{thr}$, $R_{thr1}$, $R_{thr2}$, may be determined based on data QoS. For different data QoS, different thresholds may be used. For example, for data with high reliability requirements, the thresholds $M_{thr1}$, $M_{thr2}$ may be lower than the corresponding thresholds for data with low reliability requirements.

If a function $f(K, R, M, RV_{max}, QoS)$ is above a threshold, then segmentation may be applied.

Once the decision of segmentation is made, the number of segments may be determined. The number of segments may be calculated based on the payload length K, the code rate R, the number of transmitted bits M, and/or the maximum mother code length (N) of the polar code used. Segmentation may be performed with equal length, e.g., with each segment having the same length. Zero-padding may be applied. The padded bits may be in the front of the data payload. The padded bits may be at the end of the data payload.

The number of segments may be set as $$C = \left\lceil \frac{M}{N+O} \right\rceil,$$

where M may be the number of bits to be transmitted in an initial transmission, N may be the maximum mother code length (e.g., 512 or 1024), and O may be an offset. The offset O may depend on the code rate R and/or payload size K.

The offset O may depend on the payload contents (e.g., data QoS). For example, for data with high reliability requirements, the offset may be small such that the number of information bits contained in a segment (e.g., in each segment) may be limited. For data with low latency requirements, the offset may be large such that the number of segments may be limited.

The offset value may depend on the category and/or capability of a WTRU. For high capability WTRUs (e.g., WTRUs with high computational and/or storage capabilities), the offset may be large such that the number of information bits contained in a segment (e.g., in each segment) may be large. For low capability WTRUs, the offset may be small such that the number of segments is large. The maximum mother code length N may depend on the category or capability of the WTRU. For high capability WTRUs, the value of N may be large, while the value of N may be small for low capability WTRUs. The configuration of the maximum mother code length N may be bundled with WTRU category. The configuration of the maximum mother code length N may be configured via RRC signaling. The configuration of the maximum mother code length N may be WTRU specific. For example, the maximum mother code length N may be configured during initial RRC connection setup. The maximum mother code length N may be set in the "RRC connection establishment" or "RRC connection reconfiguration" message.

The number of segments may depend on the maximum number of transmissions ($RV_{max}$). For example, the number of segments may be set as $$C = \left\lceil \frac{M \cdot RV_{max}}{N+O} \right\rceil, \text{ or as } C = \left\lceil \frac{f(M, RV_{max})}{N+O} \right\rceil,$$

where $f(M, RV_{max})$ may be a function of M and $RV_{max}$.

The number of information bits in each segment may be limited by a number $K_{max}$, and the number of segments may depend on $K_{max}$. For example, the number of segments may be set $$C = \left\lceil \frac{K}{K_{max} - CRC_{CB}} \right\rceil,$$

where $CRC_{CB}$ may be the length of CB level CRC. The value of $K_{max}$ may be bundled with WTRU category. The value of $K_{max}$ may be configured via an RRC message. The value of $K_{max}$ may depend on uplink transmissions or downlink transmissions.

The segment number may be set as the maximum of the calculations discussed above. For example, $$C = \max\left\{ \left\lceil \frac{M}{N+O} \right\rceil, \left\lceil \frac{K}{K_{max} - CRC_{CB}} \right\rceil \right\}.$$

The segment number may be set as the minimum of $$C_1 = \left\lceil \frac{M}{N+O} \right\rceil \text{ and } C_2 = \left\lceil \frac{K}{K_{max} - CRC_{CB}} \right\rceil.$$

The segment number may be set as the average of $C_1$ and $C_2$. Rounding, flooring, and/or ceiling operations may be applied when determining the segment number.

The segment number may be selected between $C_1$ and $C_2$, e.g., depending on the code rate R. For example, for a large code rate (e.g., above a threshold value or $R > R_{thre}$), the segment number may be selected as $C_2$ (e.g., since in these cases the information block size K may increase and post a processing challenge while the rate matching output size M may be of lesser concern). For a small code rate (e.g., below a threshold value or $R < R_{thre}$), the segment number may be selected as $C_1$ (e.g., since in these cases the rate matching output size M may increase and post a processing challenge while the information block size K may be of lesser concern).

Once the number of segments is determined, zeros may be padded to the front of the payload so that multiple segments (e.g., each segment) may have the same size. The number of zeros to be padded may be equal to $$\left\lceil \frac{K}{C} \right\rceil \cdot C - K.$$

One or more segments (e.g., each segment) may include $$\left\lceil \frac{K}{C} \right\rceil$$

bits.

If the number of segments is larger than 1, then one or more (e.g., each) of the C segments may be appended with a separate CRC, where the CRC length may be 24 bits and the polynomial may be $g_{CRC24C}(D)=[D^{24}+D^{23}+D^{18}+D^{17}+D^{14}+D^{11}+D^{10}+D^7+D^6+D^5+D^4+D^3+D+1]$. Other CB level CRC lengths and polynomials may use one or a combination of the disclosed implementations.

If the number of segments is equal to 1, then the TB level CRC may serve as the CB level CRC, and no additional CB level CRC may be attached.

Figure 7:
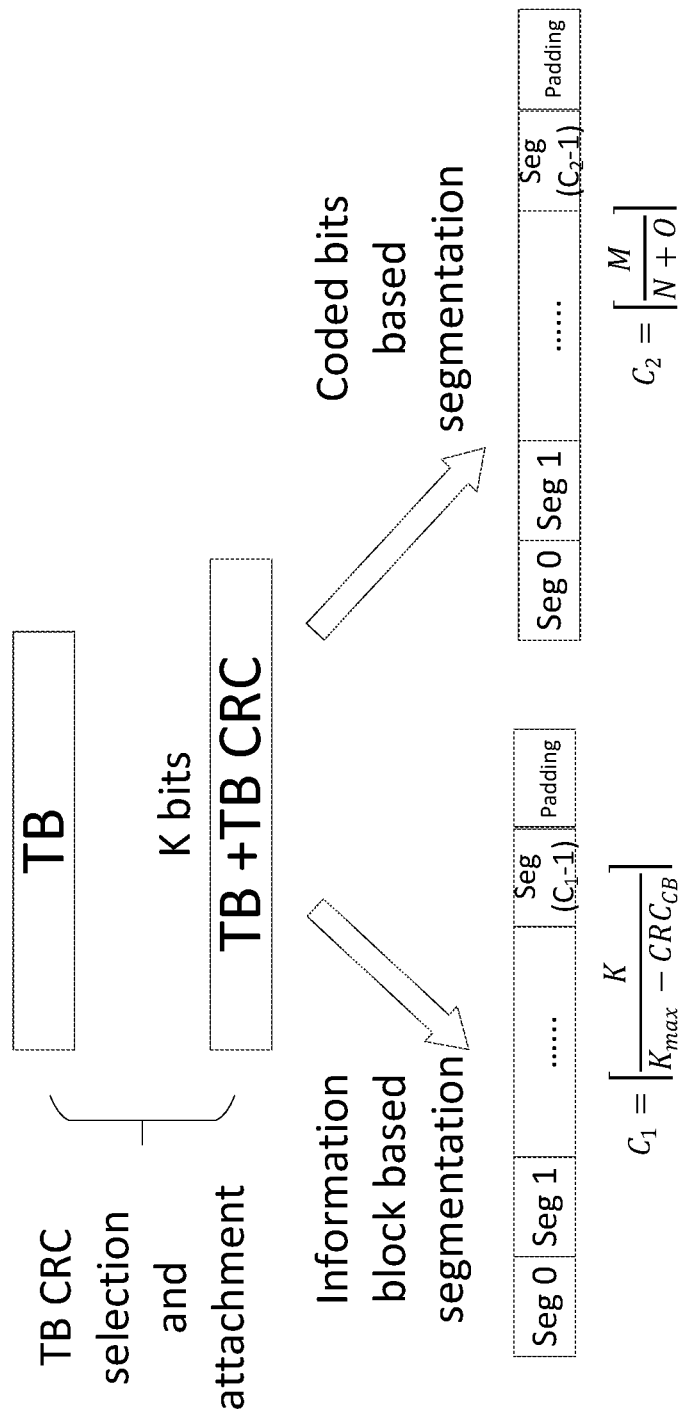
FIG. 7 is a diagram illustrating an example of CB segmentation.

FIG. 7 shows an example of TB CRC selection and attachment, and CB segmentation. The CB segmentation may be based on information block size (e.g., information block based segmentation as illustrated in FIG. 7). The CB segmentation may be based on coded block size (e.g., coded bits based segmentation as illustrated in FIG. 7).

A payload may be padded such that each segment has the same size before CB level CRC attachment. For example, zeroes may be used at (e.g., added to) the beginning and/or end of each segment. Padding implementations may be provided that may result in segments of equal size. Features described in association with such implementations may or may not depend on the segmentation used (e.g., information block based segmentation or coded bits based segmentation, etc.).

The number of segments may be equal to C and the number of information bits, for example TB plus TB CRC (e.g., original TB appended with TB level CRC), may be equal to K. The total number of padding bits may be equal to $$\left\lceil \frac{K}{C} \right\rceil \cdot C - K.$$

A padding implementation may include one or more of the following: distributed zero padding or repeated padding.

Figure 8:
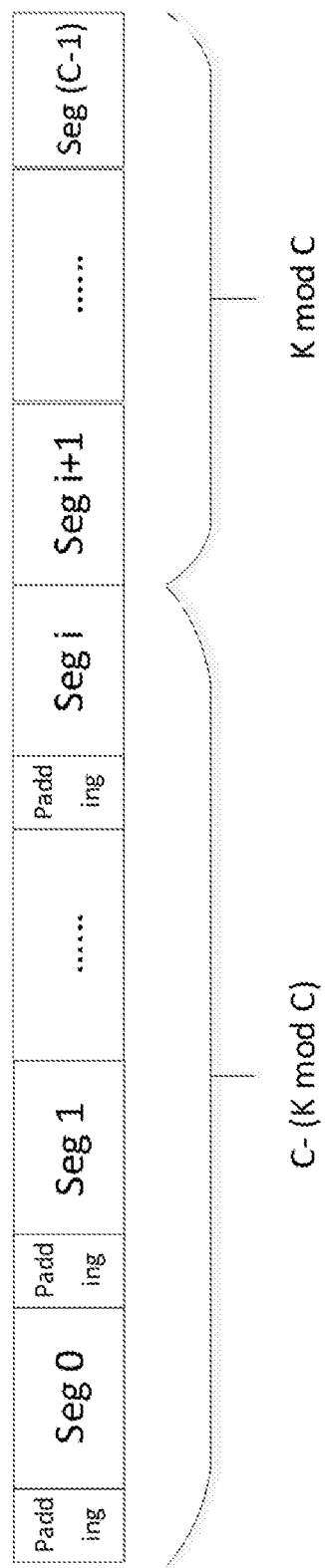
FIG. 8 is a diagram illustrating an example of distributed padding at the front of a segment.
Figure 9:
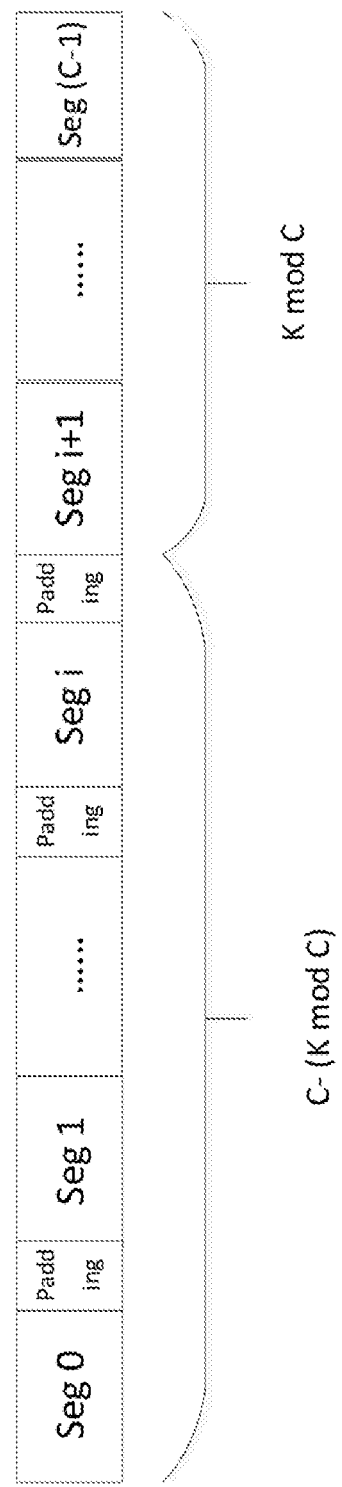
FIG. 9 is a diagram illustrating an example of distributed padding at the end of a segment.

Distributed zero padding may be implemented. Zero padding bits may be distributed over one or more segments; segments (e.g., all segments) may have a similar BLER performance. One or more segments may not be padded, e.g., when $\lceil K/C \rceil \cdot C - K$ is no more than C. The number of segments that are padded may be equal to C−(K mod C). Some of the segments (e.g., the first or last C−(K mod C) segments) may be padded with zeros, e.g., one or more zero padding bits may be distributed over C−(K mod C) segments. For example, a single zero bit may be padded for each segment. The padded zero bit may be at the front of a segment or the end of a segment. FIG. 8 shows an example of distributed padding in the front of a segment. FIG. 9 shows an example of distributed padding at the end of a segment.

Repeated padding may be implemented. Repeated padding may be pre-defined/specified. Cyclic repeating and/or extended repeating may be implemented. Payload and/or information bits near a padding location may be extended or repeated. A repeated padding implementation may include one or more of the following: the repeated bits may be copied from the current segment (e.g., locally repeated padding); the repeated bits may be copied from another segment, (e.g., globally repeated padding); or the repeated bits may be distributed over several segments.

In examples where the repeated bits may be copied from the current segment (e.g., locally repeated padding) one or more of the following may be performed. The repeated bits may be inserted to the last segment, for example, by CB-level cyclic repetition. FIG. 10 shows an example of repeated padding at the last segment (e.g., Part Seg C-1 in FIG. 10 may repeat some information bits in Seg C-1). The first $$\left\lceil \frac{K}{C} \right\rceil \cdot C - K$$

bits of the last segment may be copied and appended to the end of the last segment. The repeated bits may (e.g., alternatively) be inserted to the first segment, for example, by CB-level cyclic repetition. FIG. 11 shows an example of repeated padding at the first segment (e.g., Part Seg 0 in FIG. 11 may repeat some information bits in Seg 0). The last $$\left\lceil \frac{K}{C} \right\rceil \cdot C - K$$

of the first segment may be copied and appended to the front of the first segment.

In examples where the repeated bits may be copied from another segment (e.g., globally repeated padding), one or more of the following may be performed. The repeated bits may be inserted to the last segment, for example, by TB-level cyclic repetition. The first $$\left\lceil \frac{K}{C} \right\rceil \cdot C - K$$

bits of the last segment may be copied and appended to the end of the last segment (e.g., see FIG. 10). The repeated bits may be inserted to the first segment by TB-level cyclic repetition, e.g., the last $$\left\lceil \frac{K}{C} \right\rceil \cdot C - K$$

of the first segment may be copied and appended to the front of the first segment (e.g., see FIG. 11).

In examples where the repeated bits may be distributed over several segments, one or more of the following may be performed. C—(K mod C) segments may (e.g., each) be padded with 1 bit. A distributed repeated bit may be inserted to the front of a segment (e.g., see FIG. 8). The distributed repeated bit may be the last bit of the segment. A distributed repeated bit may be inserted to the end of a segment. The distributed repeated bit may be the first bit of the segment (e.g., see FIG. 9).

Padding bits may be inserted at positions other than the front or end of a segment. The position may be related to, for example, polar code bit channel reliability and/or decoding order. An operation to re-order padding bits may be performed after padding is performed.

Padding bits may be mapped to the least reliable bit channels of a polar encoder. Padding bits may be mapped to the bit channels of a polar encoder in a natural order (e.g., the padding bits may be mapped to the first bit channels of the polar encoder which may be treated as known bits to facilitate polar decoding). A distributed CRC based interleaver may be used when deciding which bits may be mapped to the first bit channels of a polar encoder and/or which bits may be mapped to the least reliable bit channels of a polar encoder.

Interleaving for distributed CRC may be applied, e.g., to URLLC transmissions. For a segmented code block, a distributed CRC technique may be applied. An interleaver pattern may have a size of $K_{max}$ bits. A nested structure may be used such that a payload less than $K_{max}$ bits may be expanded to $K_{max}$ bits.

Let K represent a payload size. The payload size may include CB level CRC generated as described herein. Example nested structures may be listed below.

The K bits may be expanded to $K_{max}$ bits as follows:

$y_i = x_{K-i-1}, i=0, \ldots, K-1,$ $y_i = \text{NULL}, i=K, \ldots, K_{max}-1,$ The K bits may be expanded to $K_{max}$ bits as follows:

$y_i = x_i, i=0, \ldots, K-1,$ $y_i = \text{NULL}, i=K, \ldots, K_{max}-1,$

The K bits may be expanded to $K_{max}$ bits as follows:

$y_i = \text{NULL}, i=0, \ldots, K_{max}-K-1,$ $y_i = x_{i-(K_{max}-K)}, i=K_{max}-K, \ldots, K_{max}-1,$ The K bits may be expanded to $K_{max}$ bits as follows:

$y_i = \text{NULL}, i=0, \ldots, K_{max}-K-1,$ $y_i = x_{K_{max}-i-1}, i=K_{max}-K, \ldots, K_{max}-1,$ If the payload size is small, a 16-bit CRC may be used (e.g., added). The interleaver pattern for a 16-bit CRC may be designed based on a given CRC polynomial.

Interleaved bits may be sent to a polar encoder. In an example (e.g., when limited buffer rate matching is not used for URLLC communications), the polar encoder may first map information bits (e.g., including CRC bits) to a block of N bits. The bits may then be sent to the Ariken kernel. The encoded bits may be saved to a buffer (e.g., a circular buffer) in a specific order. Rate matching and/or HARQ may be supported by selecting different bits from the buffer.

Channel interleaving (e.g., bit interleaving) may be performed. Channel interleaving or bit interleaving may be implemented by one or any combination of the following.

Selected rate-matched bits may be passed via a block of channel interleaving. The rate-matched bits may be shuffled, e.g., to relieve the impact of fading channels or high order modulation. Different types of channel interleaving techniques may be applied including, for example, parallel block interleaving with different parameters, triangular interleaving, etc. Channel interleaving techniques and their parameter selection may depend on modulation orders, data QoS, and/or redundancy version (RV) orders. For example, a triangular interleaver may be used for high order modulation, while a parallel block interleaver may be used for low order modulation. For data with higher reliability requirements, a complex channel interleaver (e.g., a triangular interleaver) may be applied. For data with lower latency requirements, a simple channel interleaver (e.g., a block interleaver) may be applied or no channel interleaver may be applied. Different channel interleavers may be applied for different transmissions (e.g., transmissions with different RV orders).

Channel interleaving may shuffle polar encoded bits to achieve diversity in high order modulation and/or fading scenarios. Pre-defined or specified rules may be applied to shuffle the polar encoded bits. For example, more important bits may be mapped to more protected positions of modulation symbols (e.g., most significant bits (MSBs) of modulation symbols). More important bits in a polar encoded sequence may correspond to more reliable bit channels, or may correspond to the information bits set.

Signaling for bit interleaving may be performed. The channel interleaving technique may be dynamically updated between transmissions (e.g., since the channel interleaving technique may depend on the data QoS, RV order, modulation order, etc.). A signaling implementation may be used to include this information in a control channel (e.g., DCI or UCI). A parameter may be used (e.g., added) in the DCI indicating, for example, which channel interleaving technique is used, or the associated parameters of a channel interleaver. For example, a single bit may be used (e.g., added) in the DCI or UCI indicating the selection between a triangular interleaver and a block interleaver. One or more additional bits may be used (e.g., added) in the DCI or UCI indicating one or more associated parameters of the selected interleaver. For example, the interleaver depth of a block interleaver or the number of parallel block interleavers may be indicated.

Bit re-ordering or code block re-ordering may be conducted. In examples (e.g., chase combining type of HARQ), transmitted bits may be re-ordered for high order modulation cases. For example, suppose the bits to be transmitted are a1, a2, a3, and a4. In the first transmission, (a1, a2, a3, a4) may be mapped to a 16QAM modulation symbol. In the second transmission, (a4, a3, a2, a1) may be mapped to a 16QAM modulation symbol. The bit re-ordering may occur per segment, per CB, and/or the like. In 16QAM modulation, the first two bits may be more protected than the last two bits. Shuffling coded bits before modulation may balance the protection of the coded bits (e.g., all coded bits), e.g., in a modulation constellation map domain. Re-ordering of polar encoded bits may be performed to diversify the reliability distribution of the polar encoded bits in the modulation mapper domain for different retransmissions.

In examples (e.g., incremental redundancy type of HARQ), transmitted bits may be re-ordered for high order modulation cases. One or more polar encoded bits may be associated with other polar encoded bits (e.g., they may be derived from common information bits). The associated polar encoded bits may be transmitted over different retransmissions. If some polar encoded bits are more protected in the modulation constellation map domain in an initial transmission, then their associated polar encoded bits may be less protected in the modulation constellation map domain in a retransmission.

Multiplexed segments may be reordered in retransmissions. Frequency diversity may be achieved if the same frequency resources are allocated for the TB. CB re-ordering may depend on RV indices.

Segments multiplexing may be applied. In examples (e.g., if a TB is segmented), rate matched bits from different segments may be multiplexed. The segment multiplexing may be applied after or before channel interleaving operations. The multiplexing may be applied in various ways, as illustrated by one or more of the following. The multiplexing may be applied by combining rate matched bits from multiple segments sequentially. The multiplexing may be applied by combining rate matched bits from multiple segments in an interlacing manner. The multiplexing may be applied by grouping rate matched bits from multiple segments. The group size may depend on the modulation order used. The grouped bits from multiple segments may then be combined in an interlacing way.

Figure 12:
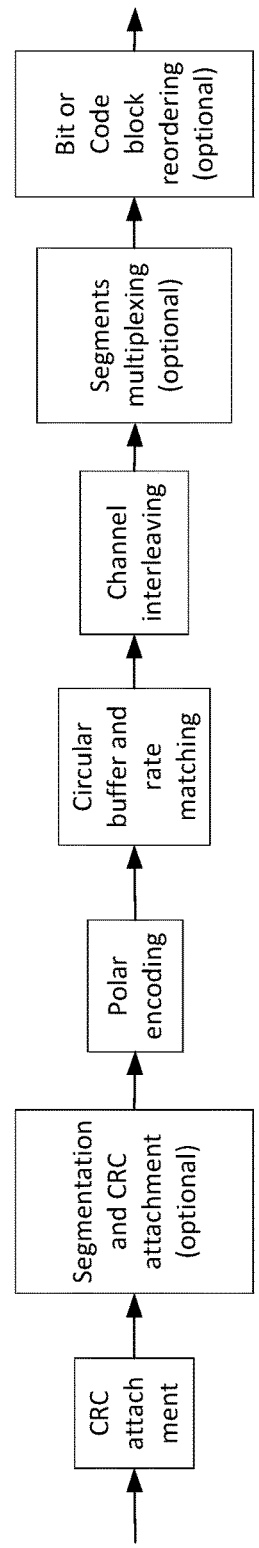
FIG. 12 is a diagram illustrating a second example polar encoder for URLLC data.

A polar encoding system architecture may be described herein in conjunction with FIG. 12, which shows an example polar encoding system for URLLC data. One or more of the following may be performed: CRC attachment, segmentation and CRC attachment, polar encoding, circular buffering and rate matching, channel interleaving, segments multiplexing, or bit or code block reordering. As shown, an interleaving block before polar encoding may be omitted. The example polar encoding system may be used for UL URLLC data channels (e.g., as early termination may not be a major concern for a base station).

MCS selection (e.g., MCS table selection as disclosed herein) may be performed, e.g., for URLLC data as described herein. URLLC data may be subject to reliability requirements. URLLC requirements may be achieved, e.g., even under bad channel conditions, with low spectral efficiency parameters. The coding rate for URLLC may be no more than a certain threshold such as 1/3. The modulation order for URLLC may be no more than a certain threshold such as 4 or 16 QAM. MCS tables may be set up based on a coding rate and modulation order. π/2-BPSK modulation may be applied for URLLC data.

The number of items in a URLLC MCS table may be small (e.g., compared to eMBB cases). The number of items in a URLLC MCS table may depend on data QoS. For different data types, different MCS tables may be used. The total number of items in an eMBB MCS table may be 32 (e.g., which may take 5 bits to indicate). The total number of items in a (e.g., each) URLLC MCS table may be less than 32. If the total number of items in a (e.g., each) URLLC MCS table is less than 16 (or 8), then 4 (or 3) bits may be used to indicate a corresponding MCS level.

Transmission bit(s) saved for URLLC (e.g., compared to eMBB) may be used to indicate an MCS table selection, e.g., as described herein, for example MCS table indices. Indices may provide an indication of which MCS table should be used. The indication of which MCS table to use may be configured via RRC signaling. The indication of which MCS table to use may be based on WTRU capability and/or WTRU category.

The saved bit(s) from MCS indices may be used to indicate bit re-ordering information. As mentioned herein, in examples such as high order modulation cases (e.g., where 16QAM may be used), the bits composing a modulation symbol may be (a1, a2, a3, a4) or (a4, a3, a2, a1). An indication of which re-ordering technique to use may be included in the DCI, for example based on saved bits from MCS indices (e.g., MCS indices in DCI).

The saved bits(s) from MCS indices may be used to indicate the maximum redundancy versions selected to channel-code a transmission. The selection may be between 2 and 4, for example. The determination of RV_max may be made at a gNB. The determination may be signaled to a WTRU. The determination may depend on WTRU capability, channel conditions, data QoS, traffic congestion status, and/or the like. One or more bits in the DCI may be used to signal the RV_max.

TBS selection may be performed, e.g., for URLLC data. One or more (e.g., two) CQI tables may be used for different modulations and coding rate coverage. The selection of a CQI table may depend on WTRU capability and/or WTRU category. The selection of a CQI table may depend on data QoS. For example, for data with higher reliability requirements, a CQI table corresponding to lower coding rates and/or lower modulation orders may be selected. For data with relatively lower reliability requirements, a CQI table corresponding to higher coding rates and/or higher modulation orders may be selected. The selection of a CQI table may be configured via RRC signaling. The selection of a CQI table may be dynamically adjusted using one or more DCI messages.

Multiple (e.g., two) target block error rates (BLERs) may be supported for URLLC, for example depending on data QoS. For example, a first target BLER level may be 10% and a second target BLER level may be 0.01%. RRC signaling may be used to select a BLER level. The selected BLER level may be included in the DCI (e.g., so that dynamic scheduling may be applied, which may support adjusted data QoS).

TBS calculation for URLLC data may be performed based on a formula (e.g., similar to eMBB cases). A temporary TBS size, denoted as $TBS_{temp}$, may be determined as illustrated below.

$$TBS_{temp} = R \cdot Q_m \cdot v \cdot N_{RE}$$

where R may represent a coding rate, $Q_m$ may represent a modulation order, v may represent the number of layers, and $N_{RE}$ may represent the number of scheduled resource elements for the relevant transmission. A final TBS, denoted as $TBS_{final}$, may ensure that it may be equally partitioned to segments without additional zero-padding and/or that quantization steps may increase with the TBS. $TBS_{final}$ may be derived as illustrated below $$TBS_{final} = \left\lceil \frac{TBS_{temp}}{QS} \right\rceil \cdot QS - TB_{CRC}. \qquad (1)$$

$TB_{CRC}$ may depend on $TBS_{temp}$. For a larger $TBS_{temp}$, $TB_{CRC}$ may be larger than that for a smaller $TBS_{temp}$. Different $TB_{CRC}$ may be selected for UL and DL. For example, $TB_{CRC}$ may be 11 bits for UL, and 19 or 24 bits for DL. QS, which may represent a quantization step, may depend on $TB_{temp}$. QS may increase monotonically with $TBS_{temp}$, as illustrated by the example formula below.

$$QS = \begin{cases} 2, & TBS_{temp} \leq 512 \\ 4, & 512 < TBS_{temp} \leq 1024 \\ 8, & TBS_{temp} > 1024 \end{cases} \qquad (2)$$

Formula (2) may be inserted into formula (1) to derive $TBS_{final}$.

A TBS table may be used to determine the TBS. This approach may increase the accuracy of TBS determination. An example TBS table may be in the form shown in Table 1 below. Each row may correspond to an MCS index. Each column may correspond to a number of physical resource blocks (N_PRB) value. The maximum number of PRBs for URLLC data may be limited (e.g., since the size of URLLC data may be limited). The size of a TBS table may be limited (e.g., may not be large).

TABLE 1

Example TBS table

| MCS index | $N_{PRB}$ | | | |
|---|---|---|---|---|
| | 1 | 2 | ... | $N_{PRB}^{max}$ |
| 0 | 16 | 32 | | 680 |
| 1 | 24 | 56 | | 904 |
| ... | | | | |
| 26 or 27 | 712 | 1480 | | 18336 |

Parameters associated with CQI may be selected for URLLC data. For example, to enhance the reliability of URLLC data transmissions, a lower modulation order and/or a lower coding rate may be used. The modulation order may be set at or below 64 QAM, for example. In examples, only Quadrature Phase Shift Keying (QPSK) may be used. In examples, only QPSK and 16QAM may be used.

Multiple (e.g., two) CQI tables may be defined for different URLLC reliability requirements. For example, a first table may be defined (e.g., configured) for a first reliability threshold (e.g., a low target BLER level such as $10^{-2}$) while a second table may be defined (e.g., configured) for a second reliability threshold (e.g., an ultra-low BLER level such as $10^{-3}$). The CQI tables may include different modulation orders (e.g., higher and lower modulation orders). For example, the CQI table associated with low BLER level may support 16 QAM and QPSK modulation, while the CQI table associated with ultra-low BLER level may support only QPSK modulation.

A CQI table associated with URLLC data may include fewer entries than a CQI table associated with eMBB data (e.g., when only QPSK and 16QAM modulations are supported for URLLC data). For example, three bits may be used for a CQI table associated with URLLC. Table 2 below shows an example CQI table for ultra-low target BLER levels. Table 3 below shows an example CQI table for low target BLER levels. In examples, (e.g., when only QPSK modulation is used, as shown in Table 2), the "Modulation" column may be omitted (e.g., to reduce transmission/storage overhead).

TABLE 2

Example CQI table for ultra-low target BLER levels

| CQI index | Modulation | Code rate × 1024 | Efficiency |
|---|---|---|---|
| 0 | QPSK | 30 | 0.0586 |
| 1 | QPSK | 78 | 0.1523 |
| 2 | QPSK | 100 | 0.1953 |
| 3 | QPSK | 120 | 0.2344 |
| 4 | QPSK | 193 | 0.3770 |
| 5 | QPSK | 308 | 0.6016 |
| 6 | QPSK | 449 | 0.8770 |
| 7 | QPSK | 602 | 1.1758 |

TABLE 3

Example CQI table for low target BLER levels

| CQI index | Modulation | Code rate × 1024 | Efficiency |
|---|---|---|---|
| 0 | QPSK | 30 | 0.0586 |
| 1 | QPSK | 60 | 0.1172 |
| 2 | QPSK | 100 | 0.1953 |
| 3 | QPSK | 193 | 0.3770 |
| 4 | QPSK | 449 | 0.8770 |
| 5 | 16 QAM | 378 | 1.4766 |

TABLE 3-continued

Example CQI table for low target BLER levels

| CQI index | Modulation | Code rate × 1024 | Efficiency |
|---|---|---|---|
| 6 | 16 QAM | 490 | 1.9141 |
| 7 | 16 QAM | 616 | 2.4063 |

Simulations may be performed to show the BLER performance of the proposed low spectral efficiency entries (e.g., the entries in Table 2 for an ultra-low target BLER level).

Figure 13:
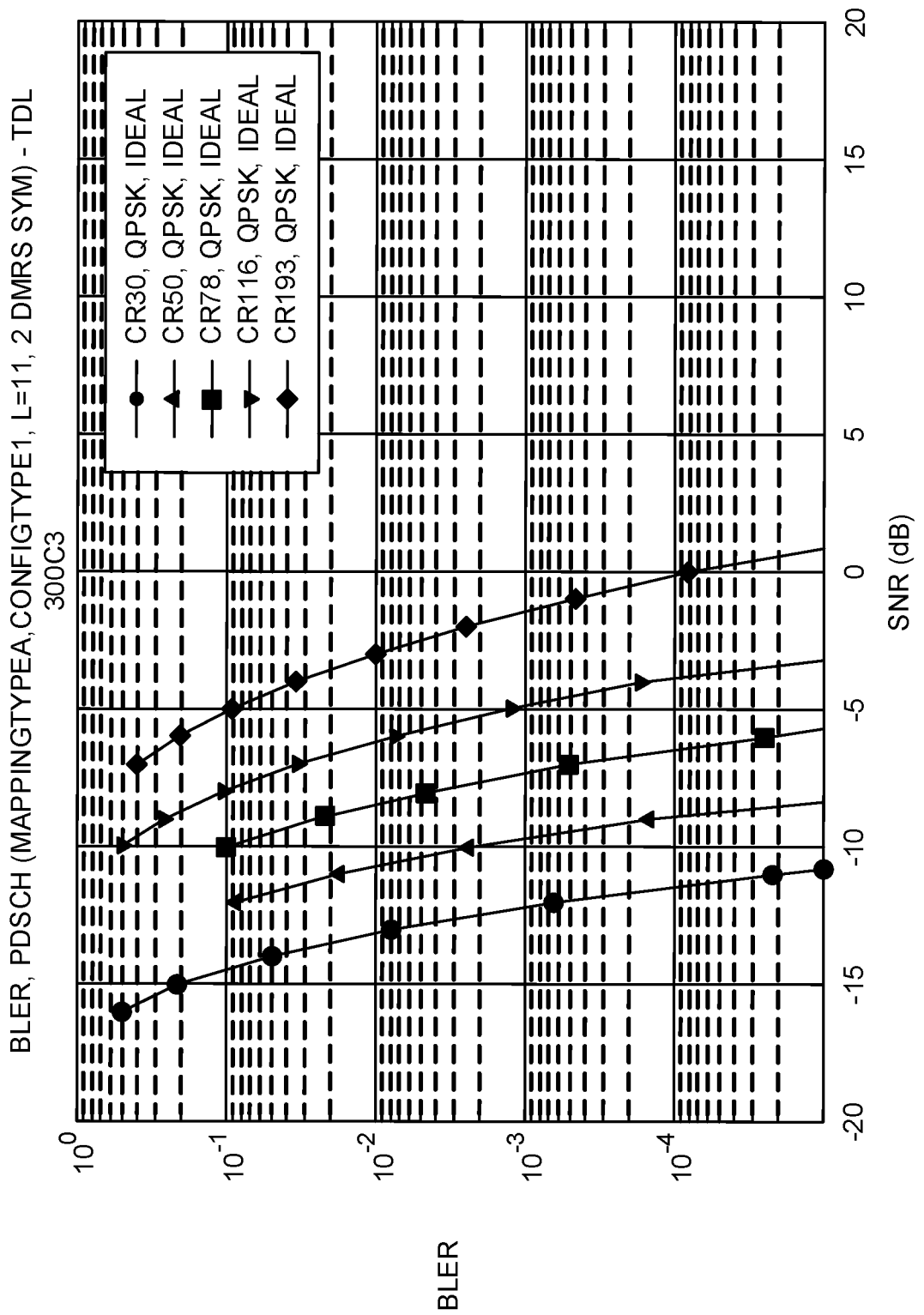
FIG. 13 is a graph showing example simulated BLER performance on a TDL-C channel model with 300 ns delay spread and certain channel estimation.

FIG. 13 shows example simulated BLER performance in a TDL-C channel model with 300 ns delay spread. In the simulations, the PDSCH DMRS are mapped to physical resources according to configuration type 1 and PDSCH mapping type A is applied. For a given payload of 32 bytes and a simulated code rate, a total of 11 OFDM symbols is used, where the PDSCH DMRS are mapped to 2 OFDM symbols. Certain channel estimation (e.g., ideal channel estimation) is assumed/used in the simulations. Code rates of 30/1024, 50/1024, 78/1024, 116/1024 and 193/1024 are simulated. The rate of 116/1024 is selected instead of 120/1024 to fit the available resource blocks.

As shown in FIG. 13, SNR separations between code rates 30/1024, 50/1024, 78/1024 and 116/1024 may be approximately equal (about 2.4 dB) at a BLER level of $10^{-5}$.

Figure 14:
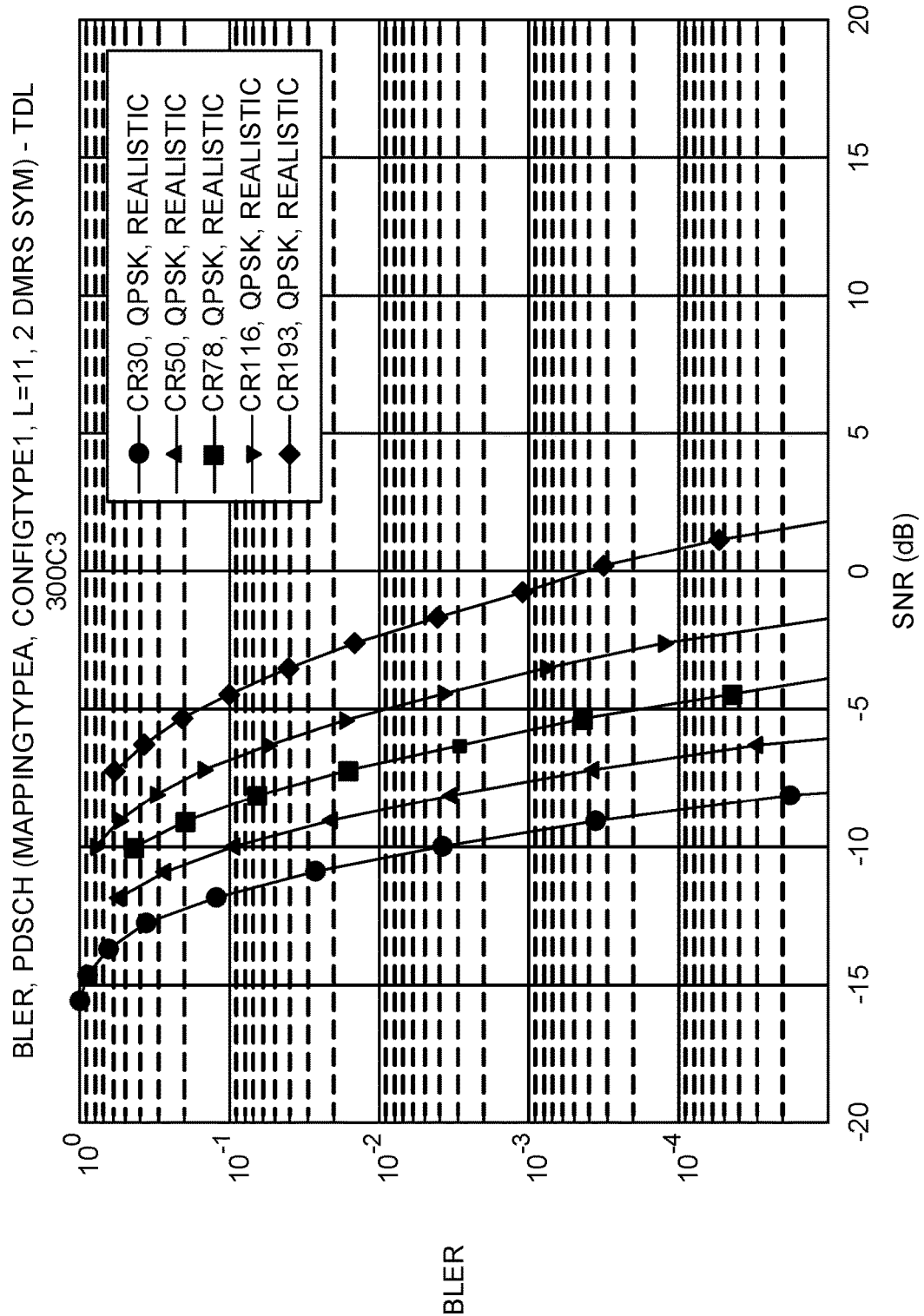
FIG. 14 is a graph showing example simulated BLER performance on a TDL-C channel model with 300 ns delay spread and certain channel estimation.

FIG. 14 shows example simulated BLER performance in a TDL-C channel model with 300 ns delay spread. A realistic channel estimation assumed/used. Other simulation settings are identical to those used in FIG. 13. It can be seen from FIG. 14 that the SNR separations between code rates 30/1024, 50/1024, 78/1024 and 116/1024 may be approximately equal (about 2.3 dB) at a BLER level of $10^{-5}$.

Figure 15:
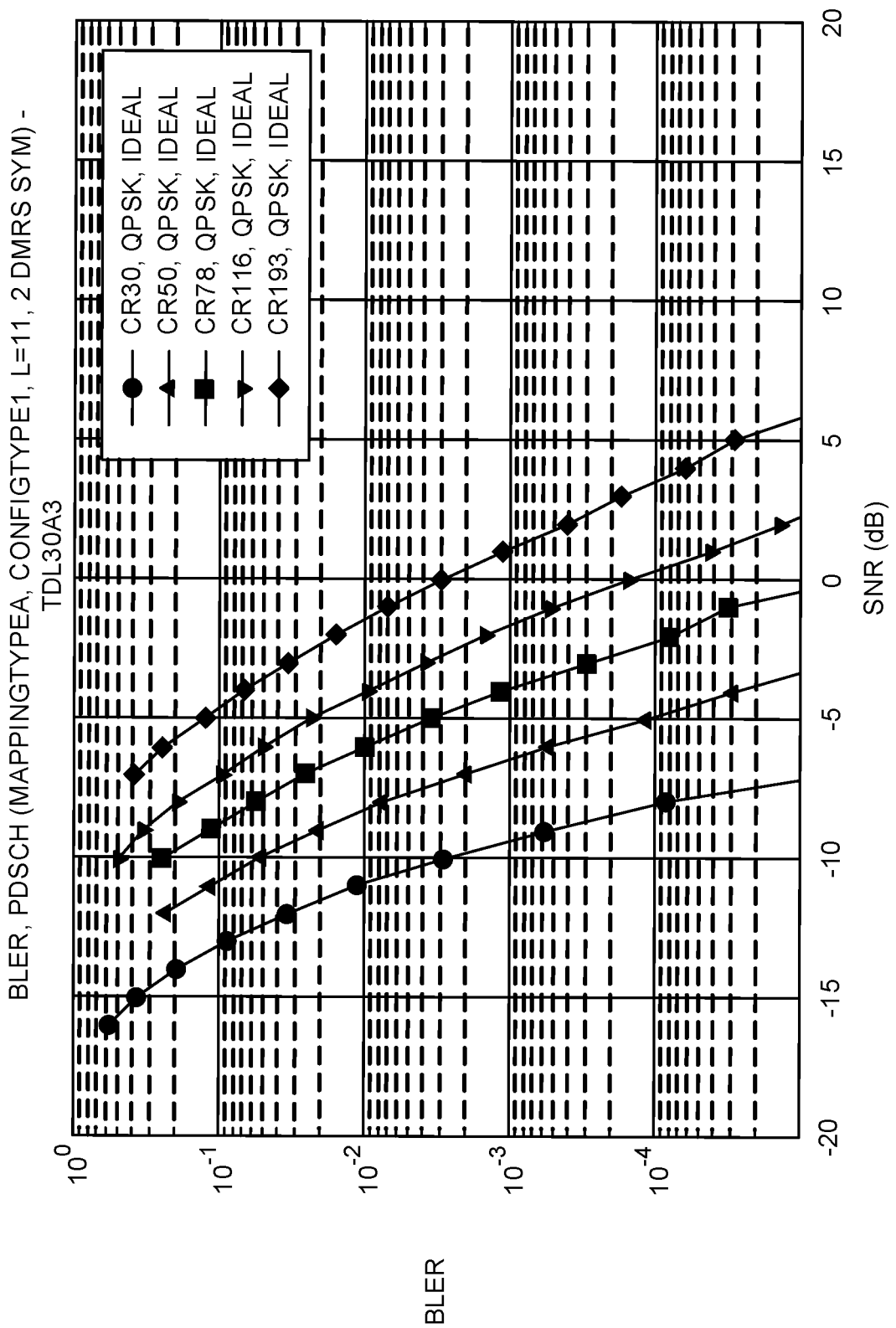
FIG. 15 is a graph showing example simulated BLER performance on a TDL-A channel model with 30 ns delay spread and certain channel estimation.
Figure 16:
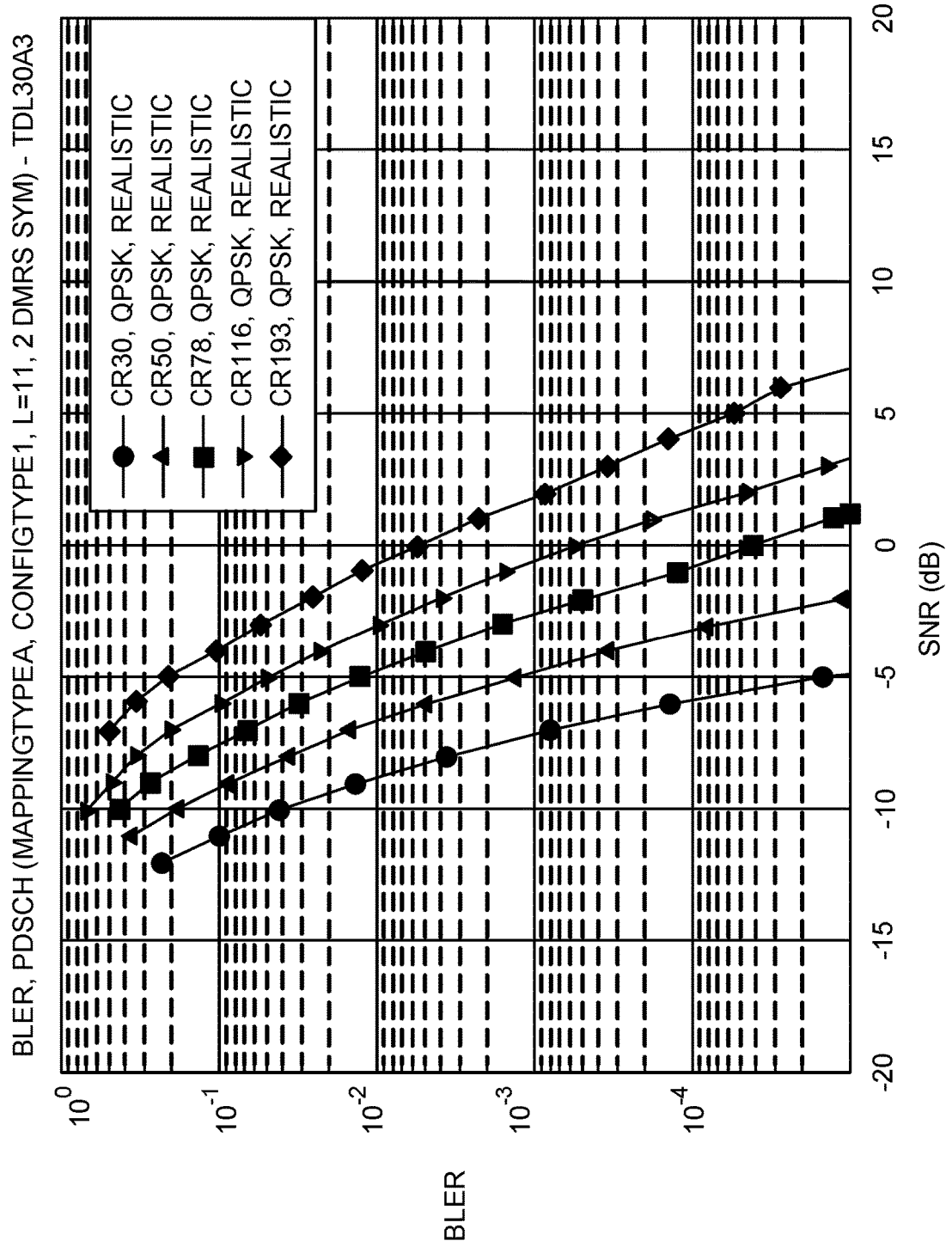
FIG. 16 is a graph showing example simulated BLER performance on a TDL-A channel model with 30 ns delay spread and certain channel estimation.

FIG. 15 and FIG. 16 show example simulated BLER performance in a TDL-A channel model with 30 ns delay spread with ideal channel estimation and realistic channel estimation, respectively. Other simulation settings are identical to those used in FIG. 13. The SNR separations between two neighbor code rates may be approximately equal at a BLER level of $10^{-5}$.

One or more DCI formats may be selected and/or used for URLLC data. In examples, a same DCI format may be used for URLLC data and eMBB data. In examples, a DCI format may be defined for URLLC data that is different than for eMBB data. In examples (e.g., where URLLC data is scheduled on PUSCH in one cell), a DCI format (e.g., format 0_2) may be used, which may include one of more of the following.

The DCI format may include a DCI format identifier. The DCI format may include frequency domain resource assignment information. The DCI format may include time domain resource assignment information. The DCI format may include a modulation and coding scheme. The DCI format may include a data indicator (e.g., a new data indicator). The DCI format may include a redundancy version. The DCI format may include a HARQ process number. The DCI format may include a TPC command for scheduled PUSCH. The DCI format may include an uplink (UL) and/or supplementary uplink (SUL) indicator.

DCI for URLLC data may have smaller payloads (e.g., compared to DCI for eMBB data). For example, three or four bits may be used to indicate a modulation and coding technique in URLLC cases (e.g., since the number of modulation techniques supported for URLLC data may be less than that for eMBB data). One bit may be used to indicate redundancy versions for URLLC. For example, the low latency requirements of certain URLLC data may allow for a single retransmission. As such, two redundancy versions may be sufficient for the URLLC data (e.g., one for an initial transmission and one for a retransmission). The number of HARQ processes for URLLC data may be smaller than that for eMBB data. Fewer number of bits may be used to indicate frequency domain resource assignment in URLLC cases than in eMBB cases (e.g., since the number of frequency domain resources may be limited for URLLC data).

The total payload size of a DCI format for URLLC data may be less than that for eMBB data. In examples, a DCI format may be defined for URLLC data. In examples, a DCI payload for URLLC data may be expanded (e.g., to be the same as the payload of DCI format 0_0). The expansion may be achieved by zero-padding, for example. Although the examples are provided herein in the context of DCI format 0_2, a similar approach may be taken for other DCI formats. For example, a DCI format 1_2 may be defined as an extension of DCI format 1_0 for eMBB data (e.g., for scheduling PDSCH in one DL cell).

Code block group (CBG) based transmissions may be sent in association with URLLC data. A larger number of CBGs may be used for URLLC (e.g., compared to the eMBB cases), e.g., accurate indications for erroneous code blocks (CBs) may be achieved. For a given number of CBs, the number of CBs in each CBG may be reduced with an increased number of CBGs. In some NR examples (e.g., with single codeword configuration), the maximum configurable number of CBGs may be 8. In some NR examples (e.g., with multiple codeword configurations), the maximum configurable number of CBGs may be 4.

The maximum configurable number of CBGs may be increased (e.g., for URLLC data transmissions). For example, the maximum configurable number of CBGs may be 16 or 32 for single codeword configuration. The maximum configurable number of CBGs may be 8 or 16 for multiple codeword configuration. The maximum number of CBGs may be {4, 6, 8, 16} or {4, 8, 16, 32} for single codeword configuration. The maximum number of CBGs may be {4, 8} for multiple codeword configurations. One or more of these examples may be used, e.g., instead of other examples illustrated in the figures.

The maximum configurable number of CBGs may depend on data QoS. For example, the maximum configurable number of CBGs for data with lower latency requirements may be more than that for data with higher latency requirements.

The maximum number of CBGs may be configured via RRC signaling, e.g., via a RRCConnectionReconfiguration message. The actual scheduled CBGs may be indicated via DCI. For example, CBG related information may be included in code block group transmission information (CBGTI). The length of CBGTI may be identical to the configured CBGs. A bit value of '1' may indicate that CBG information is transmitted. A bit value of '0' may indicate that CBG information is not transmitted. CBGTI information may be multiplexed (e.g., when multiple codewords are used). The multiplexing may increase the reliability of CBGTI information transmission.

A bitmap associated with the lengths of configured CBGs may be transmitted (e.g., for HARQ-ACK feedback). If multiple codewords are used, then the bitmaps corresponding to the multiple codewords may be multiplexed. The multiplexing may increase the reliability of HARQ-ACK information transmission.

A TB level HARQ-ACK bit may be attached to one or more CBG level HARQ-ACK bits. This may serve as an indication that one or more (e.g., all) of the CBGs have passed CRC checks, and may indicate that a TB level CRC check has failed.

The number of HARQ processes for URLLC data may be different from that for eMBB data (e.g., due to the latency requirements for URLLC data transmissions). More HARQ processes may be allocated for URLLC transmissions, for example, to process multiple TBs for URLLC data in parallel.

The number of HARQ processes may depend on WTRU capability and/or category. The number of HARQ processes may be configured based on traffic conditions. The number of HARQ processes may depend on data QoS. The number of HARQ processes may be larger for data with lower latency requirements.

CBG numbers may be dynamic, e.g., for URLLC HARQ-ACK. A CBG number (e.g., a maximum CBG number) may be configured via RRC signaling, e.g., via one or more parameters such as "maxCodeBlockGroupsPerTransportBlock" (or maxCBG/TB). The one or more parameters may be included in an information element (IE) such as "PDSCH-ServingCellConfig." A scheduled CBG number may depend on a configured maximum CBG number and/or the actual CBs in a TB. In examples (e.g., in eMBB), a bitmap may be used in certain DCI formats such as DCI format 1_1 or 0_1 (e.g., which may include a "CBGTI" field) to indicate whether scheduled CBGs are transmitted. Such a bitmap may have a length equal to the configured maximum CBG number.

Bitmaps of the same length (e.g., equal to a maximum CBG number) may be used for HARQ-ACK feedback. For example, the number of HARQ-ACK feedback bits for a TB (e.g., for each TB) may be fixed to maxCBG/TB.

Feedback mechanisms for URLLC may be enhanced, e.g., to support the high reliability and low latency requirements of URLLC data. The number of feedback bits may be increased, for example, to isolate transmission errors under certain conditions. This technique may facilitate retransmissions, e.g., by limiting CBs that are retransmitted, for example less non-error CBs transmitted, only retransmitting the error CBs, etc. Given limited resources for retransmission, reliable retransmission may be achieved based on coding gains that may result from restricting the payload sizes (e.g., the number of CBs) for retransmission.

In examples (e.g., in a legacy case), a feedback bit (e.g., each feedback bit) may correspond to a CBG. A feedback bit may be set to ACK (e.g., '1') if one or more (e.g., all) of the CBs in the corresponding CBG are decoded correctly. Otherwise, the feedback bit may be set to NACK (e.g., '0'). If a transmitted CBG number is less than maxCBG/TB, then the last (maxCBG/TB—transmitted CBG number) feedback bits corresponding to un-transmitted CBGs may be set to 0.

As described herein, a configured maximum number of CBGs for URLLC may be larger than that for eMBB. For example, the number of feedback bits for each TB may be doubled. The number of feedback bits may be set to 2*maxCBG/TB. And these 2*maxCBG/TB feedback bits may be generated as illustrated below.

Two consecutive feedback bits (e.g., each two consecutive feedback bits) may correspond to a CBG.

The first of these two feedback bits may be set to ACK (e.g., '1') if all the CBs in the first half of the corresponding CBG are decoded correctly. The first of these two feedback bits may be set to NACK (e.g., '0') if one or more CBs in the first half of the corresponding CBG are decoded incorrectly.

The second of these two feedback bits may be set to ACK (e.g., '1') if all the CBs in the second half of the corresponding CBG are decoded correctly. The second of these two feedback bits may be set to NACK (e.g., '0') if one or more CBs in the second half of the corresponding CBG are decoded incorrectly.

In the examples above for setting the feedback bits, it may be assumed that the number of CBs in a CBG is an even number. If a CBG comprises an odd number of CBs, say Y CBs, one or more the following operations may be performed. The first half of this CBG may comprise the first $$\left\lceil \frac{Y}{2} \right\rceil$$

CBs based on a ceiling operation and the second half of this CBG may comprise the last $$\left\lfloor \frac{Y}{2} \right\rfloor$$

CBs based on a floor operation. The first half of this CBG may comprise the first $$\left\lfloor \frac{Y}{2} \right\rfloor$$

CBs based on a floor operation and the second half of this CBG may comprise the last $$\left\lceil \frac{Y}{2} \right\rceil$$

CBs based on a ceiling operation.

In examples (e.g., if the actual transmitted CBG number is less than maxCBG/TB), the last 2*(maxCBG/TB−transmitted CBG number) feedback bits corresponding to untransmitted CBGs may be set to 0.

In examples, the number of feedback bits may be set to A*maxCBG/TB, where A may be an integer. These A*maxCBG/TB feedback bits may be generated in a similar manner as shown above.

In examples, the maximum values of maxCBG/TB (e.g., 8) may be used as the number of feedback bits. These feedback bits may be generated in a similar manner as shown above.

A transmitter may be configured to schedule retransmissions in accordance with received HARQ-ACK feedback bits, where the number of HARQ-ACK feedback bits may be dynamically changed, e.g., dynamically increased. One or more (e.g., all) of the CBs in an NACK-ed CBG may be retransmitted.

Figure 17:
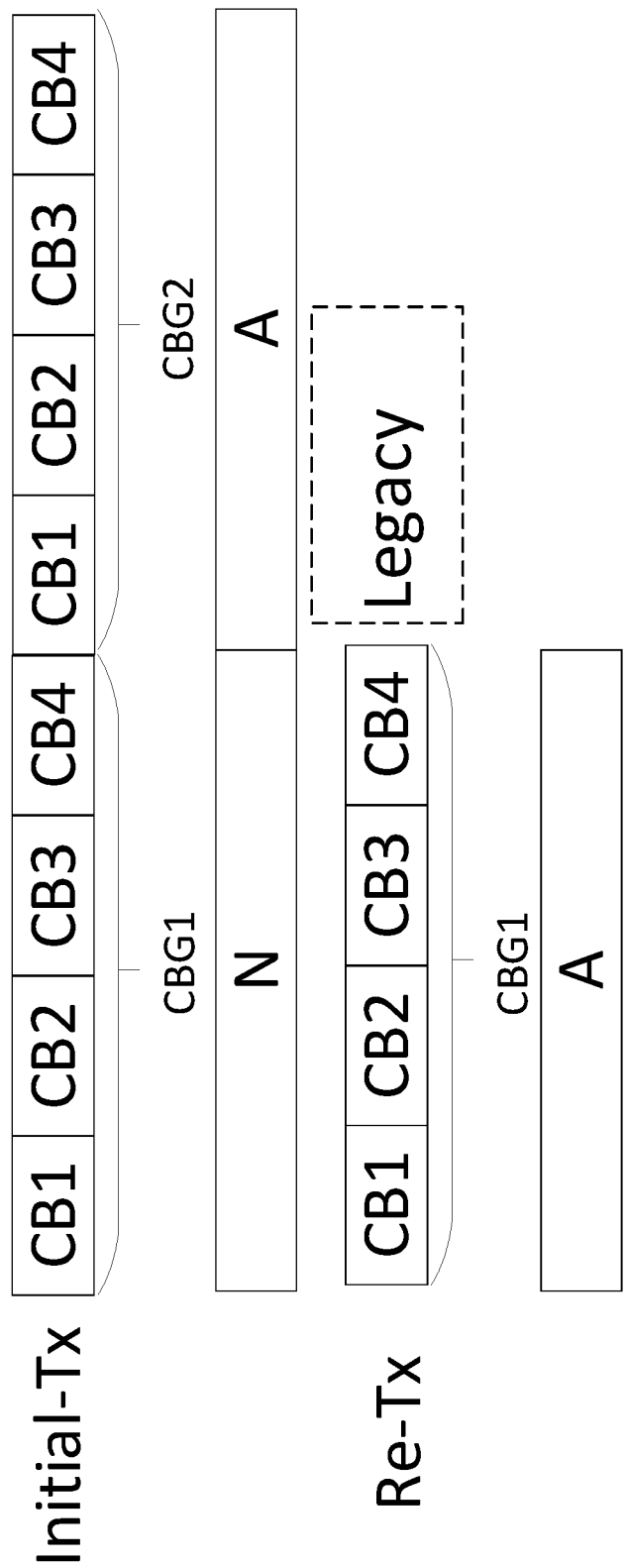
FIG. 17 is a diagram illustrating an example of a CBG-based retransmission with fixed CBG size/number.

FIG. 17 shows an example of a CBG-based retransmission with fixed CBG size. Such a technique may be used in eMBB, for example. In the example shown in FIG. 17, maxCBG/TB may be configured to be 2 and the number of CBs in a TB may be 8 in the initial transmission. The number of CBGs in the TB may be 2 and each CBG may contain 4 CBs (e.g., CBG size=4). Suppose a receiver does not decode the first CB. The receiver may send 2 HARQ-ACK bits, where the first bit may indicate NACK and the second bit may indicate ACK. A transmitter may retransmit one or more (e.g., all) of the CBs in CBG1 (e.g., CB1, CB2, CB3 and CB4), e.g., in response to the transmitter receiving the HARQ-ACK bits.

Figure 18:
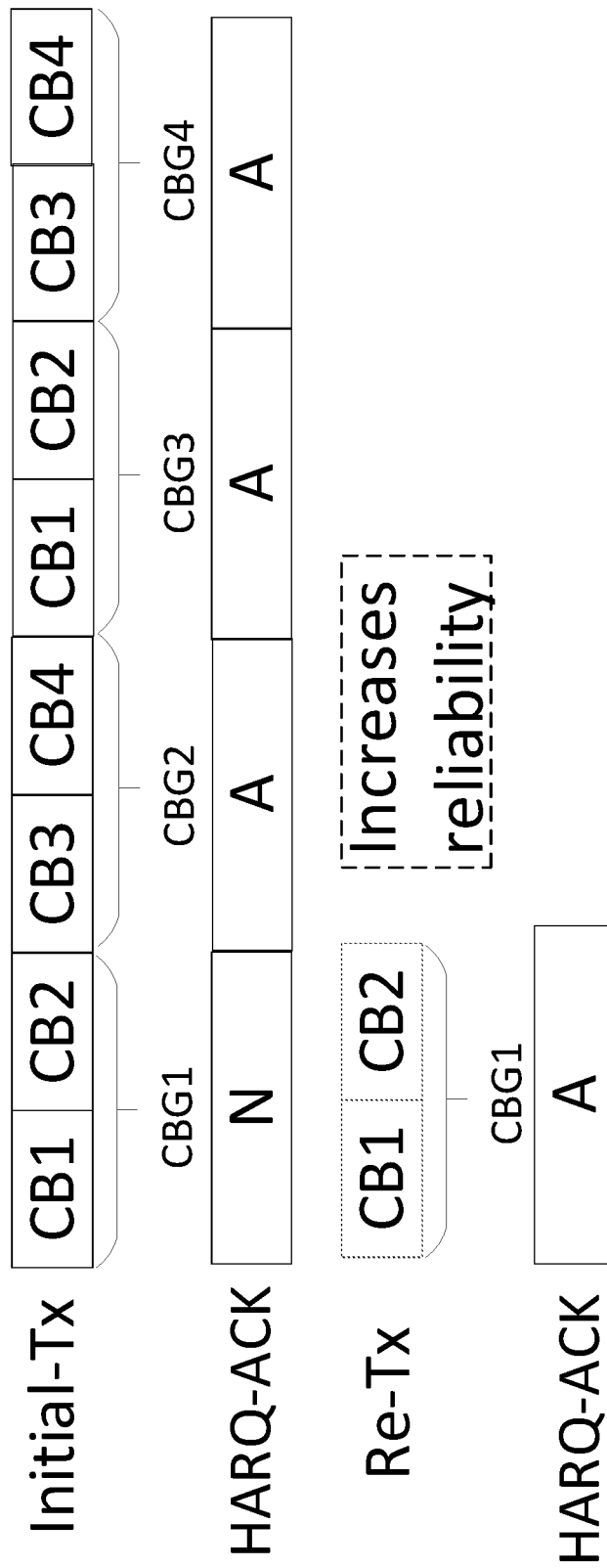
FIG. 18 is a diagram illustrating an example of a CBG-based retransmission with variable CBG size/number.

FIG. 18 shows an example of a CBG-based retransmission with variable CBG size. Suppose that the same settings used in FIG. 17 apply here (e.g., maxCBG/TB=2, number CBs/TB=8, CBG number=2, CBG size=4) and the receiver does not decode the first CB.

The receiver may send 4 HARQ-ACK bits (e.g., dynamically change from 2 to 4), where the first 2 HARQ-ACK bits may correspond to the first CBG and the last 2 HARQ-ACK bits may correspond to the second CBG. The first HARQ-ACK bit may correspond to the first 2 CBs in the first CBG, the second HARQ-ACK bit may correspond to the last 2 CBs in the first CBG, the third HARQ-ACK bit may correspond to the first 2 CBs in the second CBG, and the fourth HARQ-ACK bit may correspond to the last 2 CBs in the second CBG.

Based on the HARQ-ACK feedback, CBG size may be halved and CBG number may be doubled. For example, CBG1 may comprise CB1 and CB2. CBG2 may comprise CB3 and CB4. CBG3 may comprise CB5 and CB6. CBG4 may comprise CB7 and CB8. Once the transmitter receives the HARQ-ACK bits (e.g., the 4 bits that the receiver changed from 2), it may retransmit (e.g., only retransmit) one or more CBs (e.g., all CBs) of the CBG1 (e.g., CB1 and CB2). Using this technique, the amount of payloads in the retransmissions shown in FIG. 18 may be reduced (e.g., halved when comparing with the example of FIG. 17).

The HARQ-ACK operation for variable CBG size/number (e.g., changing from 2 to 4 as described herein, other change, etc.) as described herein may be applied under certain conditions (e.g., triggering conditions).

One of the triggering conditions may occur when there are decoding errors. If the CBGs (e.g., all the CBGs) are decoded correctly, then it may be unnecessary to increase the number of feedback bits, as all of them are ACK bits. If (e.g., only if) some CBs or CBGs are not decoded correctly, then the HARQ-ACK operation for variable CBG number may be triggered.

Another triggering condition may be related to the use of MCS tables. For example, there may be multiple MCS tables, e.g., three MCS tables, for example three MCS tables in NR (e.g., for DL transmissions or UL transmissions with CP-OFDM). One or more MCS tables (e.g., MCS table 2) may include entries with a modulation order of (e.g., a highest modulation order) of 256QAM. One or more MCS tables (e.g., MCS table 1 and MCS table 3) may include entries with a modulation order (e.g., a highest modulation order) of 64QAM. One or more MCS tables (e.g., MCS table 1) may include entries with a first code rate (e.g., a highest code rate) of 948/1024 and a second code rate (e.g., a lowest code rate) of 120/1024. One or more MCS tables (e.g., MCS table 3) may include entries with a first code rate (e.g., a highest code rate) of 772/1024 and a second code rate (e.g., a lowest code rate) of 30/1024. MCS table 3 may be referred to as a lower SE MCS table and MCS table 1 may be referred to as a higher SE MCS table. In examples, MCS table 1, MCS table 2, and MCS table 3 may be 3GPP MCS tables. A WTRU may be configured to select/use a certain MCS table via RRC signaling (e.g., by an "mcs-table" parameter, which may be in "PDSCH-config" IE or "PUSCH-config" IE). MCS table usage may be dynamically changed, e.g., using an RNTI-based approach. For example, if an additional RNTI is used for scrambling the CRC of DCI, then use of MCS table 3 may be indicated. Changes in the MCS table may trigger an increase in the HARQ-ACK bits (e.g., as described above and/or in FIG. 19).

Different MCS tables may be used in different conditions and/or for different applications. In examples (e.g., to support URLLC WTRUs with bad channel conditions such as low SNR), a MCS table (e.g., MCS table 3) comprising entries of low code rates may be used for rate adaptation for bad channel conditions. The dynamic switching from a first configured MCS table (e.g., MCS table 1) to a second MCS table (e.g., MCS table 3) may occur when channel conditions have degraded suddenly, and the low code rate entries in MCS table 3 may be used to address the channel degradation. The HARQ-ACK feedback technique with dynamic CBG size/number may be triggered (e.g., during channel degradation) to have smaller CBG size (e.g., or larger CBG count) (e.g., FIG. 19), which may provide for more accurate error CBs indication. This may reduce the number of retransmitted CBs, and increase the reliability of retransmissions, e.g., given fixed resources.

Figure 19:
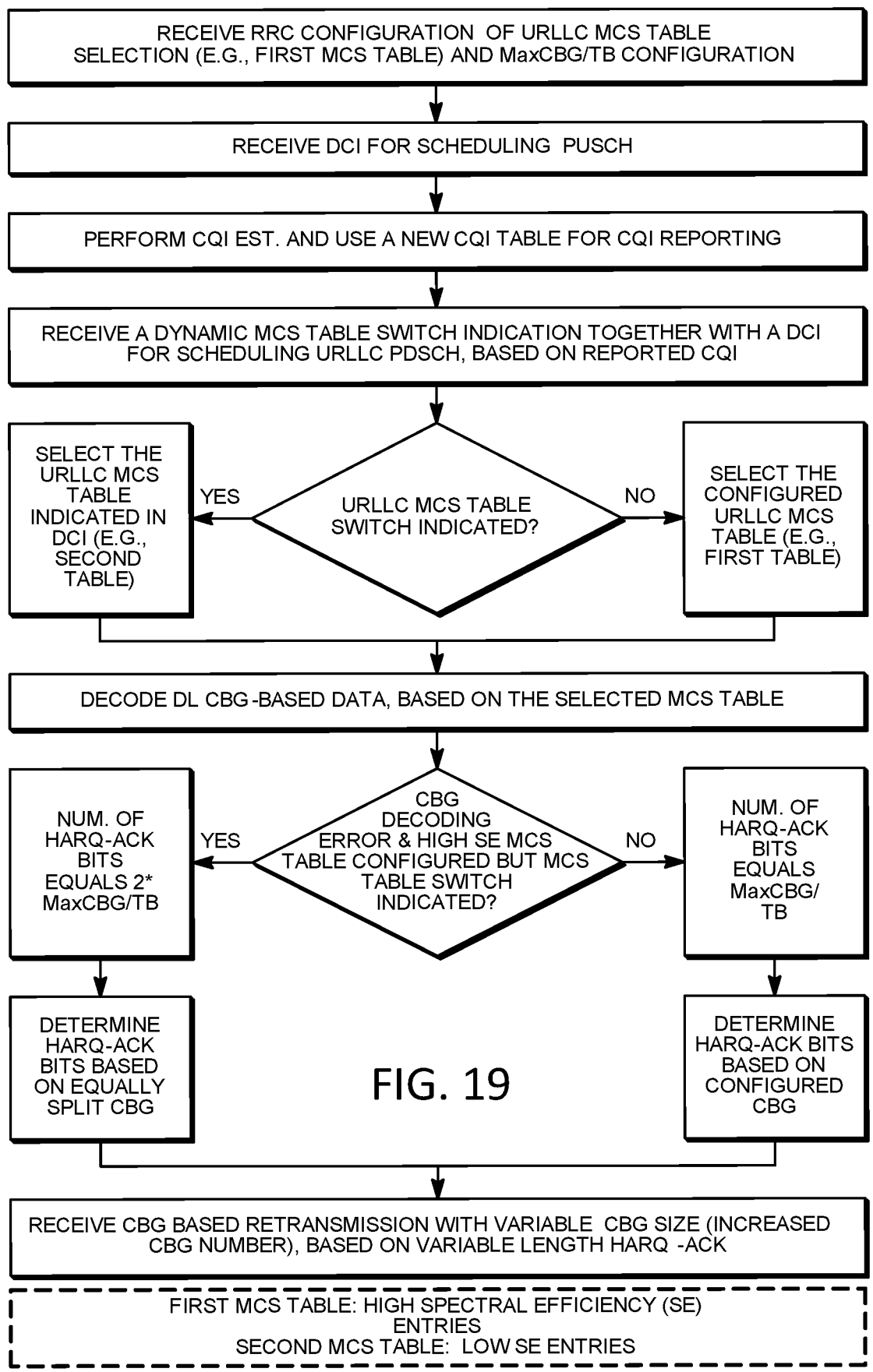
FIG. 19 is a diagram illustrating an example of a WTRU receiving URLLC DL CBG-based data and sending HARQ-ACK feedback.

Multiple triggering conditions (e.g., the two triggering conditions described above) may be jointly applied or may be separately applied. FIG. 19 shows an example of a WTRU receiving URLLC DL CBG-based data and sending HARQ-ACK feedback, which may include a WTRU increasing the number of HARQ-ACK feedback bits. One or more of the following may apply, e.g., as may be described in FIG. 19.

A WTRU may be configured with a selection of a first MCS table, for example MCS table 1, which may be configured through RRC signaling to the WTRU, e.g., with the "mcs-table" parameter in the "PDSCH-config" IE set to MCS table 1. The WTRU may be configured with an additional RNTI (e.g., a co-configured RNTI) for MCS table dynamic indication, e.g., the additional RNTI may indicate a change from the first MCS table (e.g., MCS table 1) to a second MCS table (e.g., MCS table 3), for example, which may be a change from a higher SE table a to a lower SE table.

The WTRU may receive DCI for scheduling a PUSCH (e.g., via a CSI request field), for example for aperiodic CQI estimation and reporting. The CQI reporting may be based on a CQI table corresponding to the ultra-low BLER target (e.g., $10^{-5}$). An entry (e.g., the lowest Spectral Efficiency (SE) entry) in this CQI table may be 30/1024*2 (QPSK), e.g., as shown in a CQI table such as Table 2.

A gNB may decide to dynamically switch the MCS table for its current PDSCH transmission, for example, based on a CQI report indicating bad channel conditions (e.g., low SNR). The switch may be from a first MCS table, e.g., MCS table 1, which may have been configured, to a second MCS table, e.g., MCS table 3, for example, to utilize the low SE entries in the second MCS table, e.g., MCS table 3. The dynamic switch may be indicated by the additional RNTI, e.g., which may be masked with bits of (e.g., the last 16 bits of) the CRC of the DCI.

The WTRU may receive the DCI with the CRC masked by the additional RNTI. The WTRU may determine that the second table, e.g., MCS table 3, is used in the current PDSCH transmission and the WTRU may start to decode the CBGs of the TB accordingly.

The WTRU may check if there are decoding error(s) in the current TB. If there are error(s), the WTRU may double the CBG number in its HARQ-ACK feedback, e.g., since the configured high SE MCS table (e.g., MCS table 1) is dynamically switched to the low SE MCS table (e.g., MCS table 3). The WTRU may apply one or more of the techniques described herein to generate HARQ-ACK bits. If there are no decoding errors in the current TB, the WTRU may keep the same CBG number in its HARQ-ACK feedback.

The WTRU may receive the retransmissions based on HARQ-ACK feedback. In the DCI for the retransmission, CBGTI may have the length of the dynamic CBG number (e.g., based on the HARQ-ACK feedback) or the length of the configured maximum CBG number.

As described herein, dynamic CBG numbers may be used in HARQ-ACK feedback for WTRUs configured for URLLC service. Certain WTRUs may support eMBB service and URLLC service.

A WTRU may be configured to select a single MCS table for both eMBB service and URLLC service. One or more MCS tables (e.g., MCS table 3) may be designed for URLLC service (e.g., only for URLLC service), and one or more MCS table(s) for URLLC may or may not be used for eMBB service. MCS table 1 may be configured/selected as the single MCS table for both eMBB service and URLLC service. If URLLC service is used, the usage of MCS table 3 may be triggered. This dynamic switch from MCS table 1 to MCS table 3, e.g., through the usage of the additional RNTI, may trigger a HARQ-ACK technique that utilizes variable CBG numbers, e.g., as described herein.

In examples, a first MCS table may be configured/selected for eMBB service. A second MCS table may be configured/selected for URLLC service. The first MCS table (e.g., configured for eMBB service) may be MCS table 1 or MCS table 2, for example. The second MCS table (e.g., configured for URLLC service) may be MCS table 1 or MCS table 3, for example. The distinction between eMBB service and URLLC service may not be indicated solely by the usage of MCS tables. Other techniques (e.g., other than MCS table usage) may be used to distinguish between eMBB service and URLLC service dynamically. Such techniques may include, for example, the usage of another RNTI, the usage of a DCI format specific for URLLC, etc. Based on one or more of the techniques described herein, a HARQ-ACK technique for variable CBG numbers may be triggered.

Figure 20:
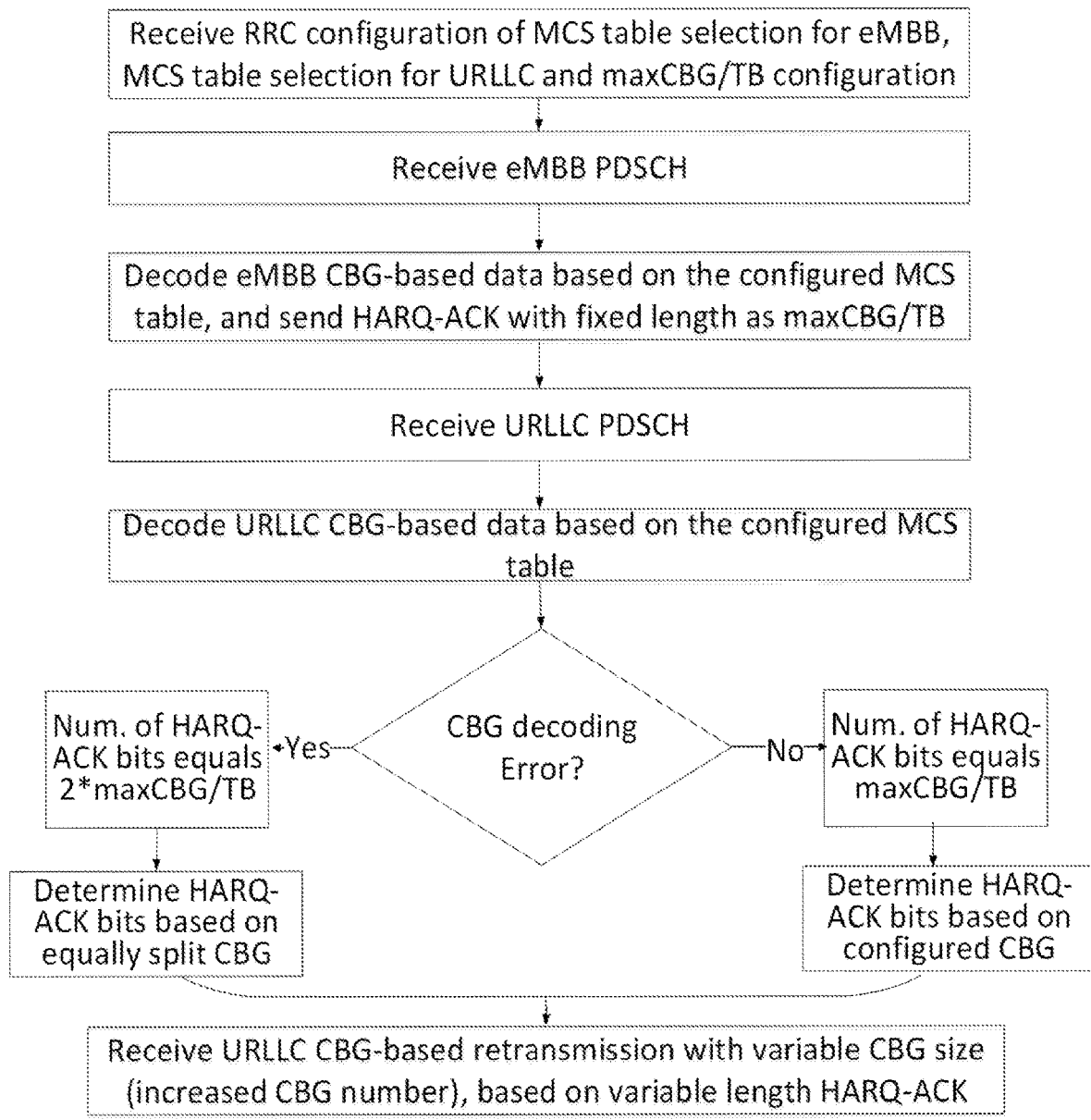
FIG. 20 is a diagram illustrating an example of a WTRU receiving URLLC and eMBB DL CBG-based data and sending HARQ-ACK feedback.

FIG. 20 shows an example of a WTRU receiving URLLC and eMBB DL CBG-based data and sending HARQ-ACK feedback.

Suppose the WTRU is configured to select a first MCS table for eMBB and a second (e.g., separate) MCS table for URLLC through RRC signaling (e.g., via the "mcs-table" parameter in the "PDSCH-config" IE). Also suppose that this WTRU is configured with a single parameter of maxCBG/TB.

When the WTRU receives (e.g., first receives) a DL eMBB PDSCH, the WTRU may decode the eMBB CBG-based data based on the configured MCS table for eMBB, and may send HARQ-ACK with a fixed length (e.g., equal to maxCBG/TB).

When the WTRU receives a DL URLLC PDSCH, the WTRU may decode the URLLC CBG-based data based on the configured MCS table for URLLC.

If the decoding of the CBGs are successful, the WTRU may send HARQ-ACK with a fixed length (e.g., equal to maxCBG/TB).

If one or more CBGs are not decoded successfully, the WTRU may send HARQ-ACK with a variable length such as 2*maxCBG/TB or other values discussed herein (e.g., as shown in FIG. 20). The construction of the HARQ-ACK bits may follow one or more of the techniques described herein. The WTRU may receive URLLC CBG-based retransmissions accordingly.

As described herein, one or more MCS table dynamic indications (e.g., multiple MCS table dynamic indications) may be transmitted (e.g., transmitted in the downlink or uplink). MCS table indications may be transmitted via a Vehicle-to-Everything (V2X) sidelink (SL). One or more of the following may apply. An MCS table selection may be indicated (e.g., may be explicitly indicated), for example in Sidelink Control Information (SCI) contents. In examples (e.g., LTE V2X), a 5-bit MCS index may be included in SCI format 1. In examples (e.g., NR V2X), the MCS table selection or indication may be included in other SCI formats (e.g., NR SCI format). A bit field in SCI, e.g., "MCS table selection," may be used to perform MCS table selection, indication, etc. If the bit field in SCI (e.g., "MCS table selection") is 0, MCS table 1 may be selected. If the bit field in SCI (e.g., "MCS table selection") is not 0, an MCS table for the SL (e.g., MCS table 3) may be selected. In examples, MCS table selection or indication may use RNTIs (e.g., different RNTIs) to scramble the CRC of the SCI. If a designated RNTI (e.g., additional RNTI) is used to scramble CRC of the SCI, MCS table 3 may be selected or indicated. If the designated RNTI (e.g., additional RNTI) is not used to scramble CRC of the SCI, MCS table 1 may be used.

One or more techniques described herein may be used to increase the reliability requirement for URLLC.

As described herein, a CQI table design with a low BLER target (e.g., $10^{-5}$) and an MCS table design (e.g., the associated MCS table design) may be provided. A URLLC use case may include a higher reliability requirement (e.g., $10^{-6}$), and a data transmission may be delivered without waiting for HARQ feedback (e.g., due to latency requirements). In examples, certain CQI and MCS tables may be designed to achieve BLER targets (e.g., BLER targets of $10^{-5}$ and/or $10^{-1}$).

An LDPC code design (e.g., the NR LDPC code design) may include an error floor issue at a BLER level of $10^{-6}$, which may be due to the parity check matrix design of the LDPC codes (e.g., a design where the LDPC codes have a small girth (e.g., the Tanner graph of an LDPC parity check matrix may include small circles)). In examples, an error floor may occur at one or more code block sizes, while an error floor may not occur at other code block sizes. One or more of the following may apply in an error floor. The BLER may not approach 0 (e.g., may not quickly approach 0) when the SNR is close to a threshold. In examples, the BLER vs. SNR curves may not include a "water fall" shape. The error floor issue may be expressed in terms of the slope of the curve. In examples (e.g., a full error floor case), the slope of the BLER vs. SNR curve may equal 0.

Figure 21:
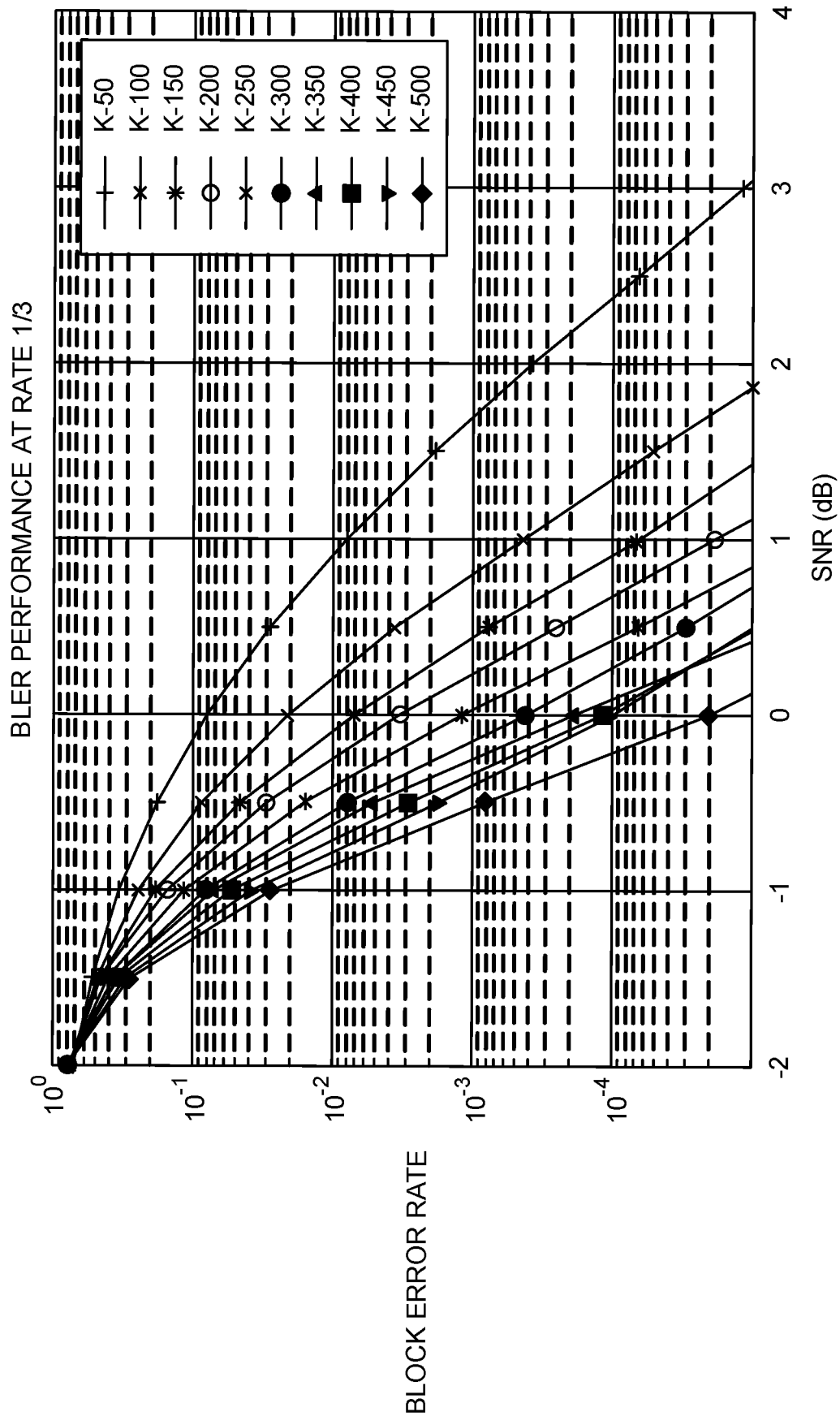
FIG. 21 is an example illustration of the BLER performance of LDPC BG2 at a 1/3 code rate.
Figure 22:
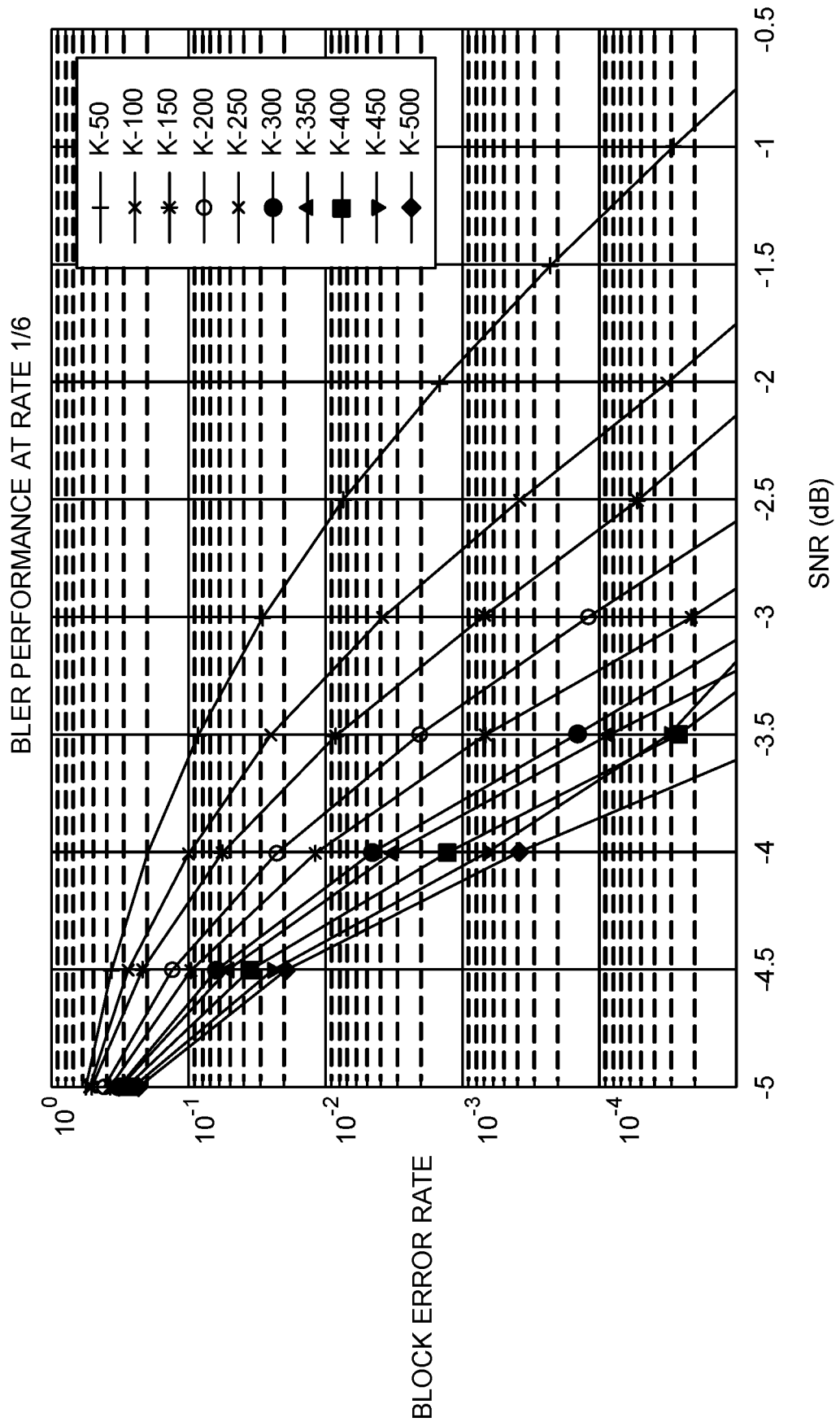
FIG. 22 is an example illustration of the BLER performance of LDPC BG2 at a 1/6 code rate.

The performance of LDPC BG2 at a target BLER level of $10^{-5}$ may be examined. One or more of the following may apply. FIG. 21 illustrates the simulation results for LDPC BG2 at a 1/3 code rate. An additive white Gaussian noise (AWGN) channel and QPSK modulation may be assumed. The code rate may be fixed (e.g., fixed to 1/3) and the information block length (e.g., including CRC) may include K=50:50:500. Sum-product decoding with a maximum number of iterations (e.g., a maximum number of iterations of 50) may be applied. As illustrated in FIG. 21, an error floor may exist for K=400, 450 bits. As illustrated in FIG. 21, when K=450, the curve (e.g., the curve when further extended) may not reach $10^{-5}$ (y-axis) at an SNR of −3.5 dB (x-axis). As illustrated in FIG. 21, when K=450, the curve (e.g., the curve when further extended) may reach $10^{-5}$ at an SNR of approximately −3.2 dB. If the curve at K=450 is extended further down, the curve may reach $10^{-6}$ at a high SNR value. FIG. 22 illustrates the results of a simulation with LDPC BG2 for the code rate of 1/6 and an information block length (e.g., including CRC) of K=50:50:500. As illustrated in FIG. 22, an error floor may exist for K=450 bits.

CQI and/or MCS tables may be designed to achieve a BLER target (e.g., a BLER target of $10^{-6}$). In examples, a CQI table (e.g., the CQI table for the BLER target of $10^{-5}$ used in NR URLLC) and a MCS table (e.g., the current MCS table including low spectrum efficiency entries) may be reused. Error floor issues may be identified and/or addressed. One or more of the following may apply. In examples, the combinations of code block sizes (CBS) and MCS entries which have error floor issues (e.g., severe error floor issues) may be identified (e.g., may first be identified). A set of the identified entries with error floor issues (e.g., including CBS, MCS index) may be composed and the set may be called A. The set A may be composed or pre-defined, and the set A may be determined for an LDPC BG (e.g., each LDPC base graph(BG)).

In examples (e.g., on a condition that URLLC data is determined to be transmitted), a transmitter may calculate (e.g., may first calculate) the CBS from the TBS and coding rate. The calculation may be based on the TBS size and the MCS index information. The transmitter may determine whether the CBS belongs to the set A (e.g., based on the CBS and MCS index information). If the combination of the CBS and MCS index does not belong to set A, the transmitter may proceed and send the data. If the calculated combination of CBS and MCS index belongs to set A, the transmitter (e.g., transmitting entity) may apply the appropriate value of K repetitions of the TBs, which may increase the SNR values and achieve a BLER target of $10^{-6}$.

The value of K may be configured or may be dynamically determined based on the CBS and MCS index. One or more of the following may apply. In examples, the value of K may be 1, 2, 4, or 8. If the value K is dynamically determined based on CBS and MCS index, set A may be partitioned into subsets (e.g., may be further partitioned into several subsets). In examples, the set A may include: $A=A_2 \cup A_4 \cup A_8$. Error floors may be associated with different severity levels, and the different severity levels may be measured in terms of the slope of a curve illustrating the relationship between BLER (e.g., block error rate) and SNR. In examples, a severe error floor may include a slope value close to 0. In examples, the larger the absolute value of the BLER vs. SNR curve's slope, the smaller the severity of the error floor issue. Subset $A_2$ may include the combinations (e.g., CBS, MCS index) with a first error floor level, which may be associated with a large absolute value of the BLER vs. SNR curve's slope. Subset $A_4$ may include the combinations (e.g., CBS, MCS index) with a second error floor level, which may be associated with a smaller absolute value of the BLER vs. SNR curve's slope. Subset $A_8$ may include the combinations (e.g., CBS, MCS index) with a third error floor level corresponding to an even smaller absolute value of the BLER vs. SNR curve's slope. In examples, the combinations of CBS and MCS index with the first error floor level (e.g., Subset $A_2$) may be associated with a first K value (e.g., K=2). In examples, the combinations of CBS and MCS index with the second error floor level (e.g., Subset $A_4$) may be associated with a second K value (e.g., K=4). In examples, the combinations of CBS and MCS index with the third error floor level (e.g., Subset $A_8$) may be associated with a third K value (e.g., K=8). In examples, the combinations of CBS and MCS index with a fourth error floor level may be associated with a fourth K value (e.g., K=1). One or more of the following may apply. The absolute slope value associated with the fourth error floor level may be larger than the absolute slope value associated with the first error floor level. The absolute slope value associated with the first error floor level may be larger than the absolute slope value associated with the second error floor level. The absolute slope value associated with the second error floor level may be larger than the absolute slope value associated with the third error floor level.

Figure 23:
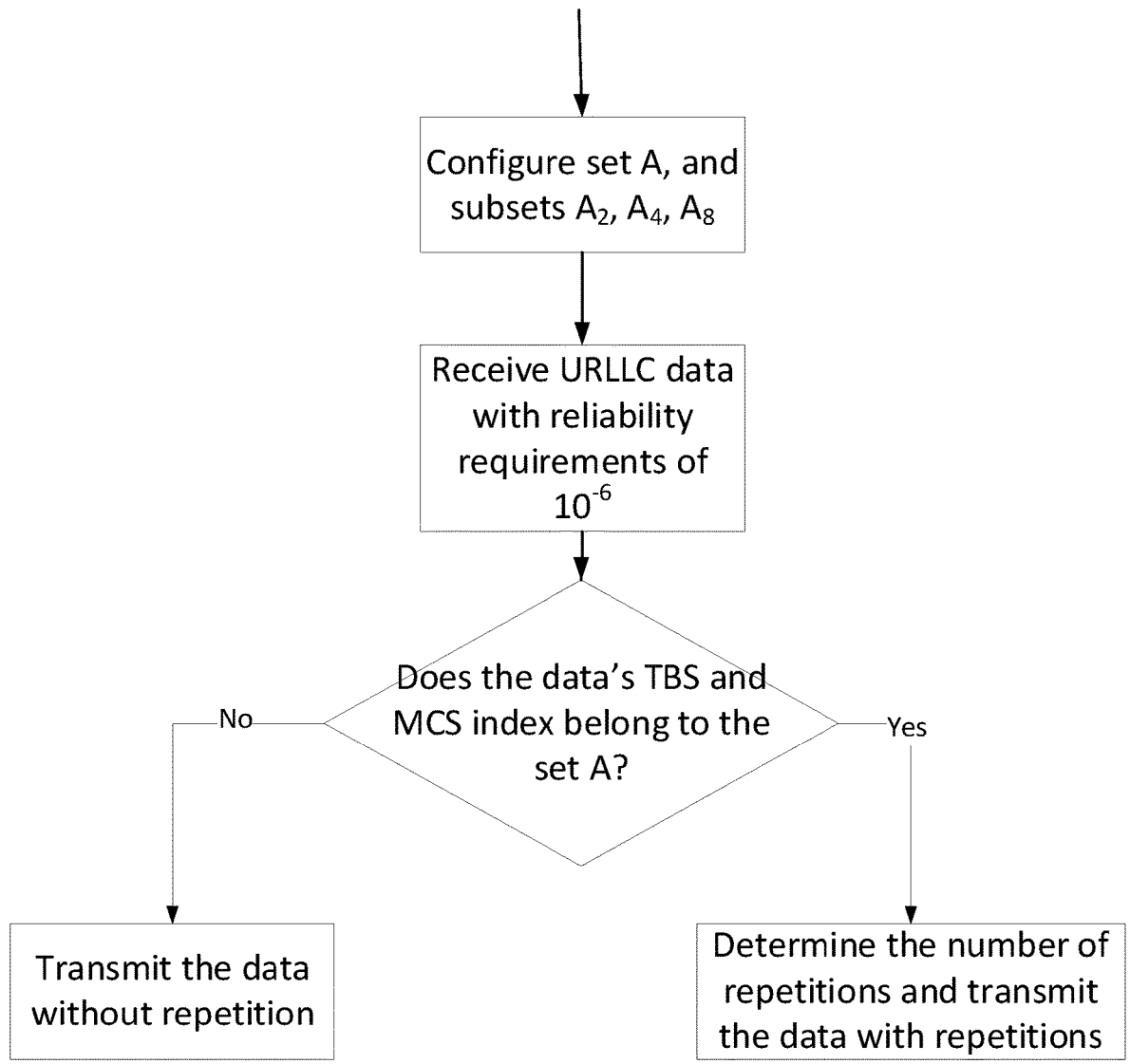
FIG. 23 is an example associated with repeating data transmissions.

FIG. 23 illustrates an example to determine the K values.

Although examples are described herein in the context of URLLC and/or eMBB, the techniques described herein may be applied to other types of services, to a link (e.g., a main link) between a gNB and a WTRU and/or to a sidelink between multiple WTRUs (e.g., for V2X applications).

Although the features and elements described herein may be described in embodiments or in particular combinations, each feature or element may be used alone without the other features and elements of the embodiments or in various combinations with or without other features and elements described herein.

Although the features and elements described herein consider LTE, LTE-A, New Radio (NR), and/or 5G specific protocols, it should be understood that the features and elements described herein are not restricted to LTE, LTE-A, New Radio (NR), and/or 5G specific protocols and may also be applicable to other wireless systems.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:

1. A wireless transmit/receive unit (WTRU), comprising:
a processor configured at least in part to:
receive configuration information indicating a first and a second modulation and coding scheme (MCS) tables;
receive a transport block comprising code block groups;
determine a number of hybrid automatic repeat request acknowledgement (HARQ-ACK) bits to send for the received code block groups, wherein the number of HARQ-ACK bits to send is determined based on whether an indication is received to switch from the first MCS table to the second MCS table;
decode code blocks associated with the transport block according to the received indication; and
send a HARQ-ACK feedback having the determined number of HARQ-ACK bits.

2. The WTRU of claim 1, further comprising:
on a condition that the indication to switch from the first MCS table to the second MCS table is not received or there is no decoding error, the processor is further configured to send HARQ-ACK bits wherein the number of HARQ-ACK bits is equal to a maximum number of code block groups per transport block (maxCBG/TB); and
on a condition that the indication to switch from the first MCS table to the second MCS table is received and there is a decoding error, the processor is further configured to send HARQ-ACK bits wherein the number of HARQ-ACK bits is equal to two times the maxCBG/TB.

3. The WTRU of claim 2, wherein on the condition that the indication to switch from the first MCS table to the second MCS table is received and there is the decoding error, a number of HARQ-ACK bits are generated by equally splitting code block groups.

4. The WTRU of claim 1, wherein the processor is further configured to receive a retransmission of a number of code blocks, wherein the retransmitted number of code blocks is associated with the sent number of HARQ-ACK bits.

5. The WTRU of claim 3, wherein:
on a condition that the sent number of HARQ-ACK bits is equal to a maximum number of code block groups per transport block (maxCBG/TB), the retransmitted number of code blocks equals a number of code blocks in the transport block divided by the maxCBG/TB; or
on a condition that the sent number of HARQ-ACK bits is equal to two times the maxCBG/TB, the retransmitted number of code blocks is equal to half a value of: the number of code blocks in the transport block divided by the maxCBG/TB.

6. The WTRU of claim 1, wherein on the condition that the indication to switch from the first MCS table to the second MCS table is received, the indication is indicated by a radio network temporary identifier (RNTI), and wherein the RNTI is masked with bits of a cyclic redundancy check of downlink control information.

7. The WTRU of claim 1, wherein the processor is further configured to select an MCS table based on the received indication, and, use the selected MCS table to decode code blocks.

8. The WTRU of claim 7, wherein the processor is further configured to perform channel quality indicator (CQI) estimation and report CQI based on a CQI table for a lower block error rate target, wherein a lowest code rate in the CQI table is 30/1024.

9. A method comprising:
receiving configuration information indicating a first and a second modulation and coding scheme (MCS) tables;
receiving a transport block comprising code block groups;
determining a number of hybrid automatic repeat request acknowledgement (HARQ-ACK) bits to send for the received code block groups, wherein the number of HARQ-ACK bits to send is determined based on whether an indication is received to switch from the first MCS table to the second MCS table;
decoding code blocks associated with the transport block according to the received indication; and
sending a HARQ-ACK feedback having the determined number of HARQ-ACK bits.

10. The method of claim 9, further comprising:
on a condition that the indication to switch from the first MCS table to the second MCS table is not received or there is no decoding error, the method further comprises sending HARQ-ACK bits wherein the number of HARQ-ACK bits is equal to a maximum number of code block groups per transport block (maxCBG/TB); or on a condition that the indication to switch from the first MCS table to the second MCS table is received and there is a decoding error, the method further comprises sending HARQ-ACK bits wherein the number of HARQ-ACK bits is equal to two times the maxCBG/TB.

11. The method of claim 10, wherein on the condition that the indication to switch from the first MCS table to the second MCS table is received and there is the decoding error, a number of HARQ-ACK bits are generated based on equally splitting code block groups.

12. The method of claim 9, further comprising receiving a retransmission of a number of code blocks, wherein the retransmitted number of code blocks is associated with the sent number of HARQ-ACK bits.

13. The method of claim 12, wherein:
on a condition that the sent number of HARQ-ACK bits is equal to a maximum number of code block groups per transport block (maxCBG/TB), the retransmitted number of code blocks equals a number of code blocks in the transport block divided by the maxCBG/TB; or on a condition that the sent number of HARQ-ACK bits is equal to two times the maxCBG/TB, the retransmitted number of code blocks is equal to half a value of: the number of code blocks in the transport block divided by the maxCBG/TB.

14. The method of claim 9, wherein on the condition that the indication to switch from the first MCS table to the second MCS table is received, the indication is indicated by an a radio network temporary identifier (RNTI), and wherein the RNTI is masked with bits of a cyclic redundancy check of downlink control information.

15. The method of claim 9, wherein the method further comprises selecting an MCS table based on the received indication, and, using the selected MCS table to decode code blocks.

16. The method of claim 15, wherein the method further comprises performing channel quality indicator (CQI) estimation and reporting CQI based on a CQI table for a lower block error rate target, wherein a lowest code rate in the CQI table is 30/1024.

* * * * *